United States Patent [19]

Malinowski et al.

[11] 4,340,864
[45] Jul. 20, 1982

[54] FREQUENCY CONTROL SYSTEM

[75] Inventors: Christopher W. Malinowski, Untereisesheim; Heinz Rinderle, Heilbronn, both of Fed. Rep. of Germany

[73] Assignee: Licentia Patent-Verwaltungs G.m.b.H., Frankfurt am Main, Fed. Rep. of Germany

[21] Appl. No.: 217,404

[22] Filed: Dec. 17, 1980

Related U.S. Application Data

[63] Continuation of Ser. No. 957,006, Nov. 2, 1978, abandoned.

[30] Foreign Application Priority Data

Oct. 16, 1978 [DE] Fed. Rep. of Germany ....... 2844936
Oct. 16, 1978 [DE] Fed. Rep. of Germany ....... 2844938
Oct. 16, 1978 [DE] Fed. Rep. of Germany ....... 2844939
Oct. 16, 1978 [DE] Fed. Rep. of Germany ....... 2845005
Oct. 16, 1978 [DE] Fed. Rep. of Germany ....... 2845006

[51] Int. Cl.³ .................... H03D 13/00; H03L 7/00
[52] U.S. Cl. .................... 328/133; 307/525; 331/1 A; 331/2; 331/11; 331/17; 331/27
[58] Field of Search ............ 331/1 A, 2, 11, 12, 331/17, 18, 25, 27; 328/133, 21, 22; 307/525, 526, 527, 528, 514

[56] References Cited

U.S. PATENT DOCUMENTS 3,909,735   9/1975   Anderson et al. ............... 331/17 X

*Primary Examiner*—Siegfried H. Grimm
*Assistant Examiner*—Edward P. Westin
*Attorney, Agent, or Firm*—Spencer & Kaye

[57] ABSTRACT

A circuit for producing a frequency dependent output signal in response to two a.c. input signals, including a converter unit connected to receive the two a.c. input signals for furnishing an output signal having a d.c. component which varies in dependence on changes in the value of a relationship between the frequencies of the two a.c. input signals, and a frequency generator connected to the converter unit for producing an a.c. output signal whose frequency is a function of the value of such d.c. component.

1 Claim, 47 Drawing Figures

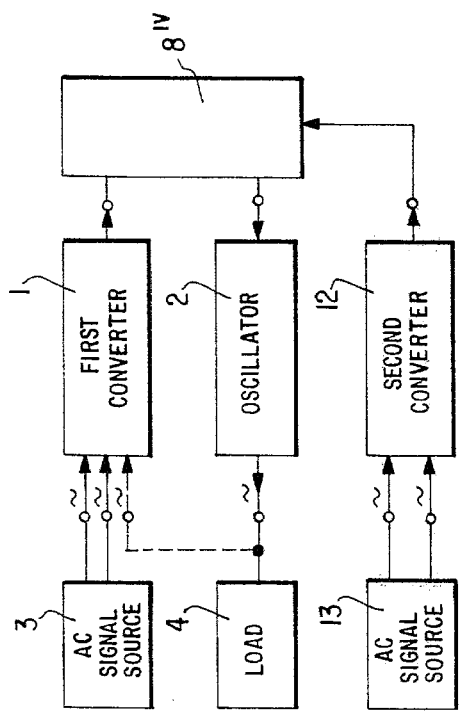
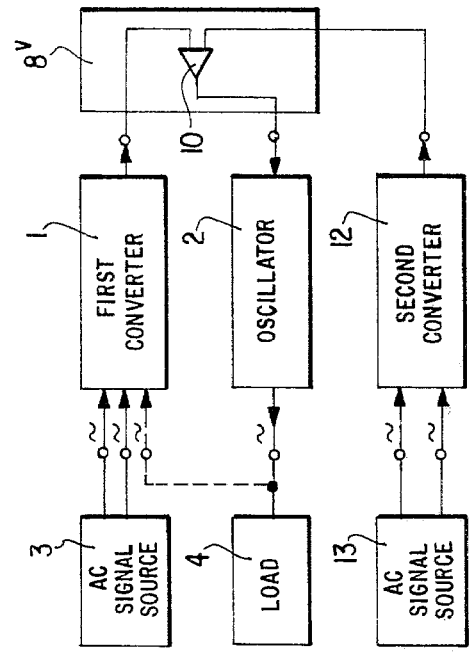
FIG. 14
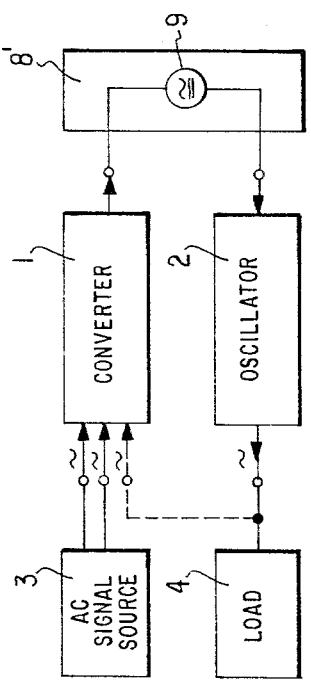
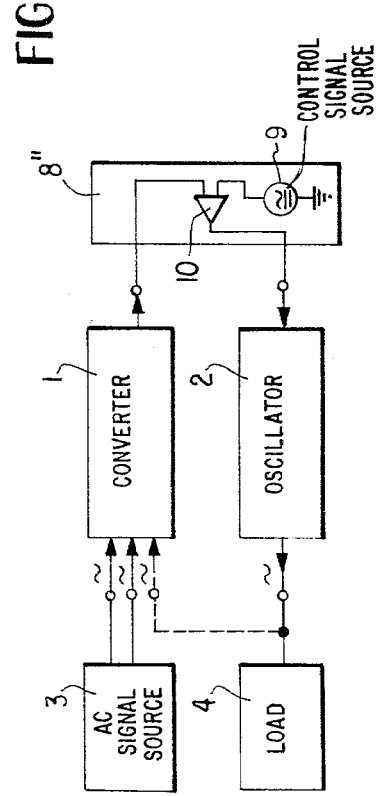
FIG. 11   FIG. 12   FIG. 13   FIG. 15

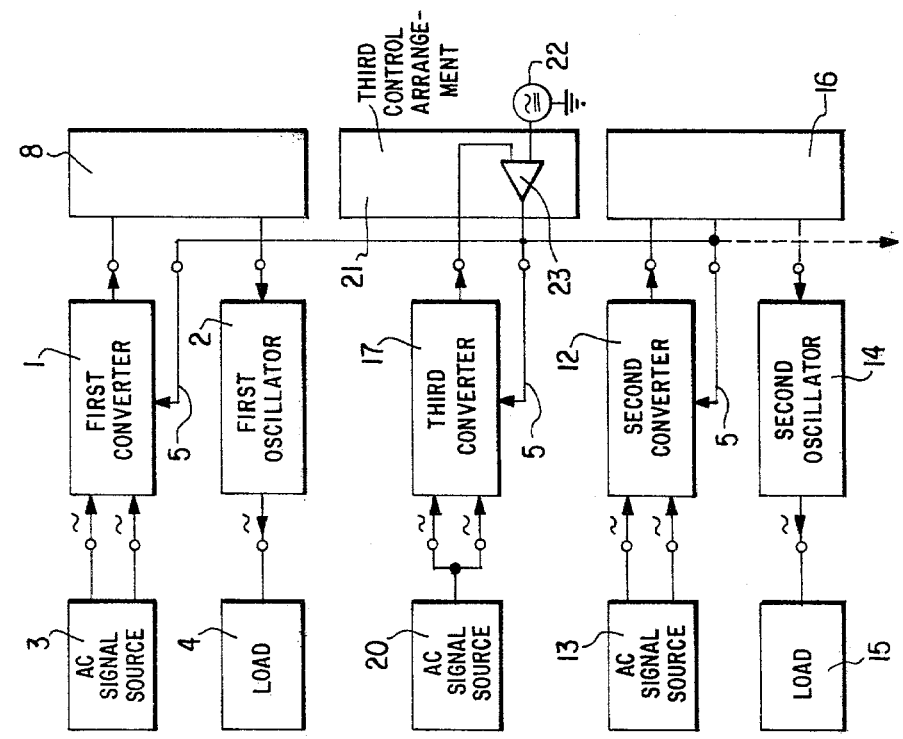
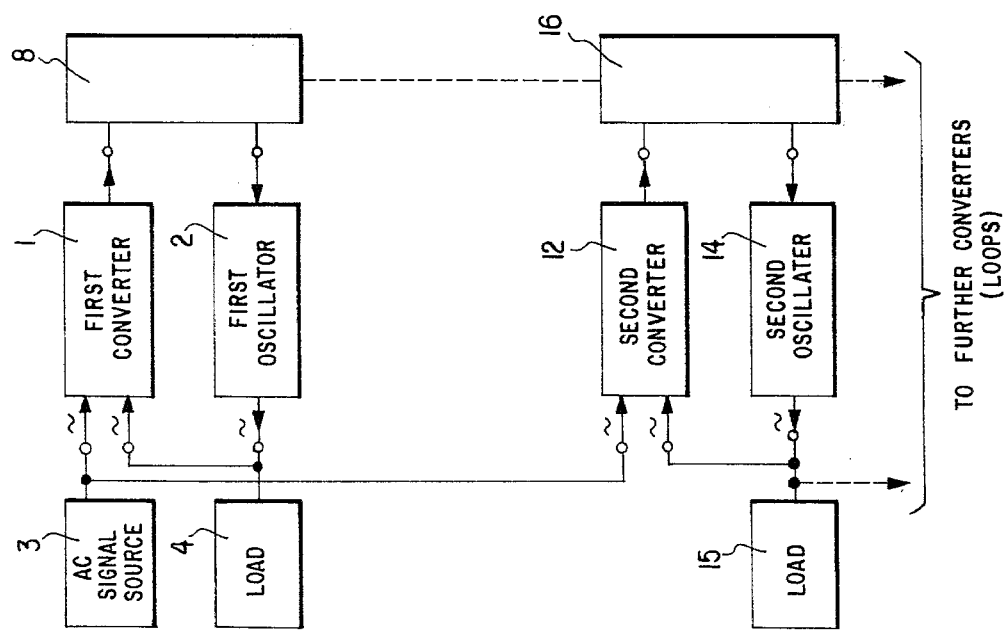

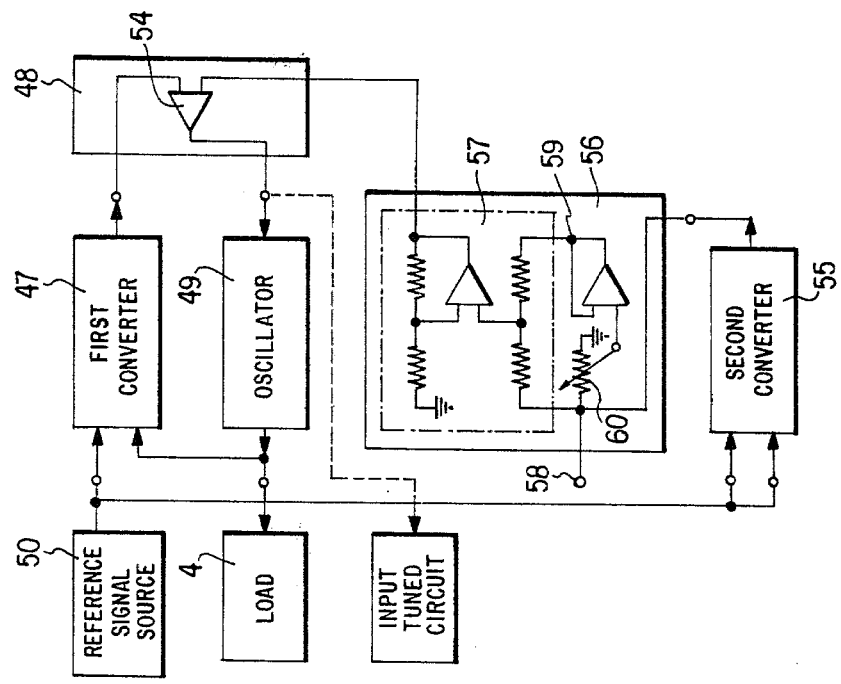
FIG. 39
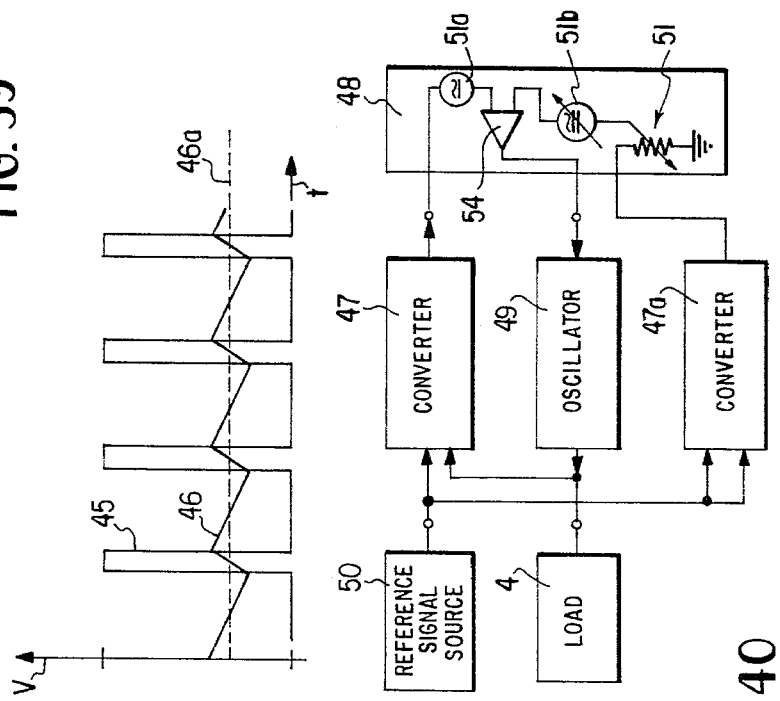
FIG. 40
FIG. 42
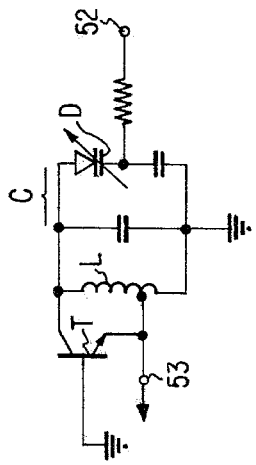
FIG. 41

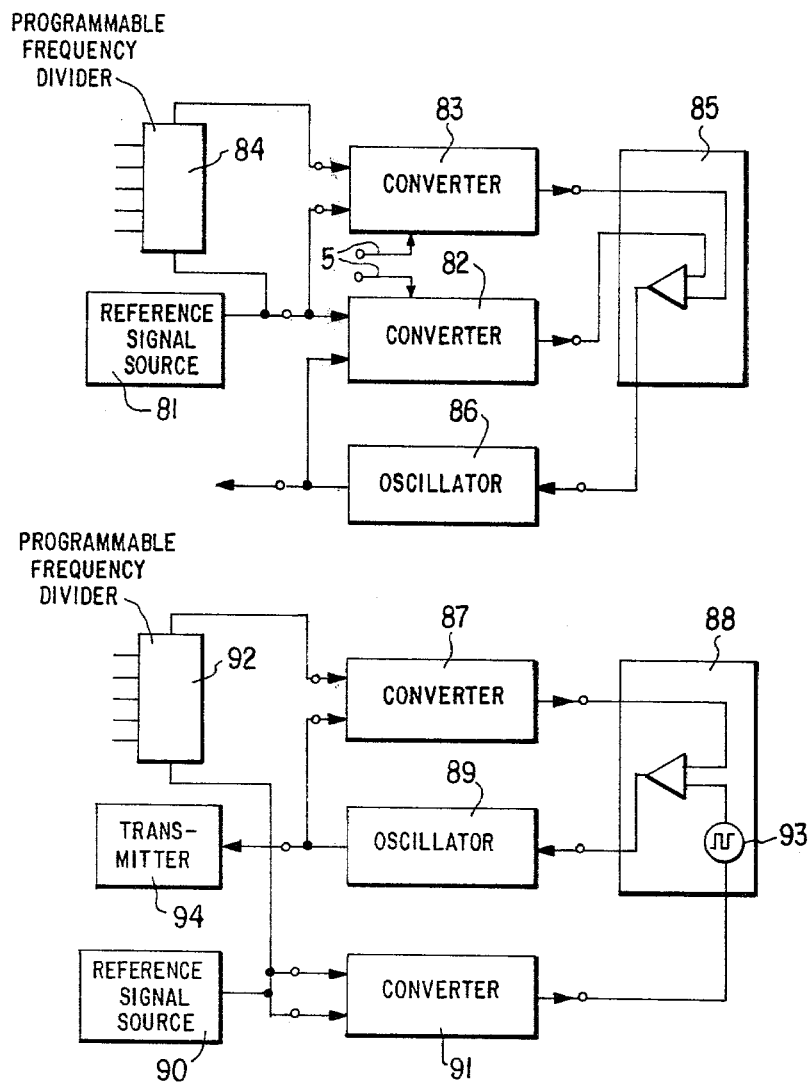

FREQUENCY CONTROL SYSTEM

CROSS-REFERENCE TO RELATED APPLICATION

This application is a continuation of application Ser. No. 957,006, filed Nov. 2, 1978 now abandoned.

BACKGROUND OF THE INVENTION

The present invention relates to signal processing circuitry, particularly for generating frequency-dependent signals.

It is known that in many technological fields, problems are encountered in connection with the processing, and particularly the controlling and regulating, of signals. The solution to a number of these problems is presently technologically impossible or unacceptably expensive.

SUMMARY OF THE INVENTION

It is a primary object of the present invention to provide circuit modules which can solve these problems in a simple and inexpensive manner.

The basic module for achieving these objects according to the invention is a circuit arrangement for receiving at least two a.c. input signals and producing a frequency dependent signal, which arrangement furnishes a direct component that changes in value in proportion to the relationship between two frequencies and serves to produce an output signal whose frequency is a function of this frequency relationship.

By appropriately expanding this basic module as well as combining several of the modules, the present invention provides completely novel circuit arrangements which are suitable, for example, for signal conversion, function conversion, frequency synthesis and frequency analysis applications.

Such circuit arrangement constitutes, for example, frequency/voltage converters, voltage-frequency converters, voltage/frequency/voltage converters, signal adders, signal squarers, function generators for forming the radical of a signal, receiver tuning systems, synchronism tuning arrangements, remote control systems, frequency modulators, frequency demodulators, frequency measuring devices, coders and decoders, speed regulators and speed controllers.

BRIEF DESCRIPTION OF THE DRAWING

FIGS. 2–30 are block circuit diagrams of further modules according to the invention.

FIG. 39 is a waveform diagram illustrating the output signal from a pulse processor according to the invention.

FIG. 40 is a block circuit diagram of an oscillator tuning circuit according to the invention.

FIG. 41 is a circuit diagram of one embodiment of an oscillator employed in modules according to the invention.

FIGS. 42 and 43 are block circuit diagrams of further embodiments of oscillator tuning circuits according to the invention.

FIGS. 46 and 47 are block circuit diagrams of embodiments of further circuits according to the invention.

DESCRIPTION OF THE PREFERRED EMBODIMENTS

Figure 1:
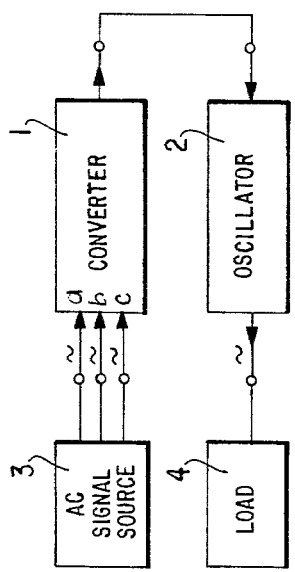
FIG. 1 is a block circuit diagram of a basic module according to a preferred embodiment of the invention.

FIG. 1 shows a basic module according to the invention which includes a converter 1 and a frequency generator 2. The converter 1 is responsive to an a.c. signal source 3 which furnishes two a.c. input signals that are fed to converter 1 through different respective inputs.

The converter 1 is constructed to furnish at its output a signal having a direct component, the value of which is a function of a particular relationship between the frequencies of the input signals in a certain frequency range and changes in proportion with changes in that relationship. Stated in other terms, the value of the direct component of the output signal from converter 1 is a function of $f_1/f_2$, where $f_1$ is the frequency of the first input signal and $f_2$ is the frequency of the second input signal.

In the embodiment shown in FIG. 1, the first input signal is fed to the input a of converter 1 and the second input signal to the input b of converter 1. If the two converter inputs are exchanged, however, and thus the first input signal is fed to input b and the second input signal to input a of converter 1, a change in value of the direct component of the output signal of converter 1 is no longer proportional to a change in $f_1/f_2$, but rather proportional to a change in $f_2/f_1$. The term direct component is intended to mean the direct current component or direct voltage component, respectively, of a signal.

In addition to the total frequency relationship, the output signal of the converter may also depend on the keying ratio of at least one of the input signals. This will be discussed below in connection with the detailed description of the converter. The output signal from converter 1 controls the frequency generator 2 and thus controls the frequency of the output signal of the frequency generator which simultaneously is the output signal of the basic module. The basic module of FIG. 1 can be used by itself, for example as a controllable frequency generator which drives or supplies a load 4.

Figure 2:
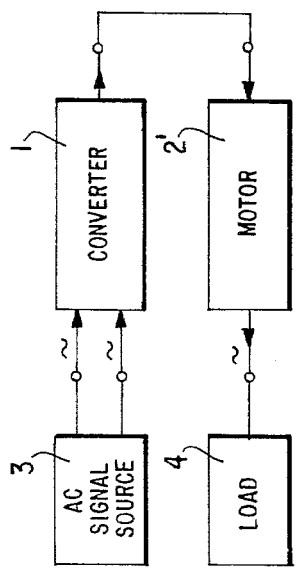

The module, or arrangement, of FIG. 2 differs from that of FIG. 1 in that the frequency generator 2 is replaced by a motor $2^I$. The motor $2^I$ is controllable in that it is driven at a rate proportional to the direct component of the output of converter 1, and furnishes at its output an alternating signal which depends on its rate of rotation.

Figure 3:
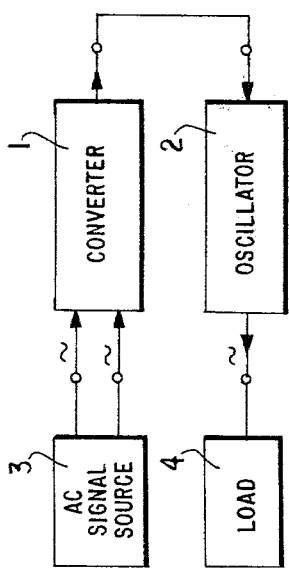

In the arrangement of FIG. 3, a voltage- or current-controlled oscillator 2 is provided as the frequency generator. The arrangement of FIG. 4 differs from that of FIG. 3 in that, instead of only two input signals, three input signals are provided. Of course, more than three input signals can be present at the inputs of the converter and are preferably fed to separate inputs. This also applies for all equivalent arrangements to be described below.

While the first signal at the input a and the second signal at the input b assure that the output signal from the converter is dependent on the frequency relationship between these two input signals, the third a.c. input signal at the input c exerts a further influence on the output signal of the converter in that the output signal from converter 1 can be directly or inversely proportional to the frequency $f_3$ of the third signal.

Figures 4, 5, 6:
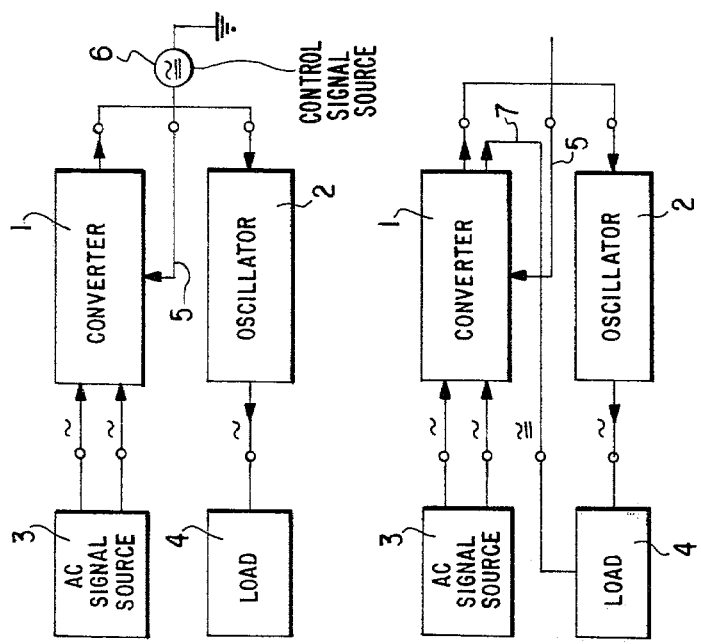
Figure 1:
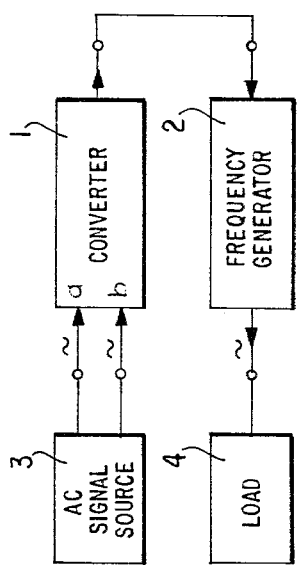

The arrangement shown in FIG. 5 differs from that of FIG. 3 in that a control electrode 5 which is fed by a control source 6 is additionally provided at converter 1. It may be desirable to provide the converter with one or several such control electrodes, depending on the particular application, for the arrangements described below even if they are not specifically mentioned there. The control source 6 may furnish a d.c. signal, an a.c. signal, a signal having both d.c. and a.c. components. In contradistinction to the a.c. input signals from source 3, the control signal at the control electrode 5 may thus be a d.c. signal or a d.c. signal with an a.c. component.

The arrangement shown in FIG. 6 differs from that of FIG. 3 in that the converter 1 has an additional output 7 which is connected to load 4. The output signal of the converter 1 at the output 7 is controlled, for example, with respect to its phase and/or amplitude by the control signal at control electrode 5. The output signal at output 7 of the converter 1 may be used, for example, for amplitude and/or phase modulation.

Figure 7:
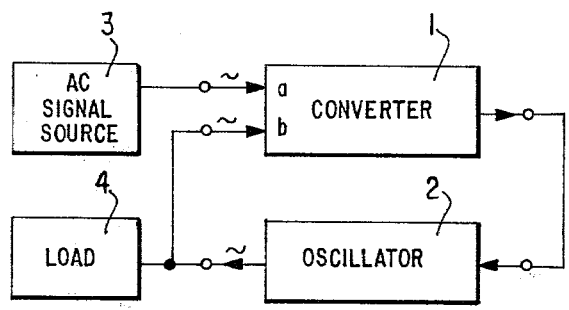
Figure 8:
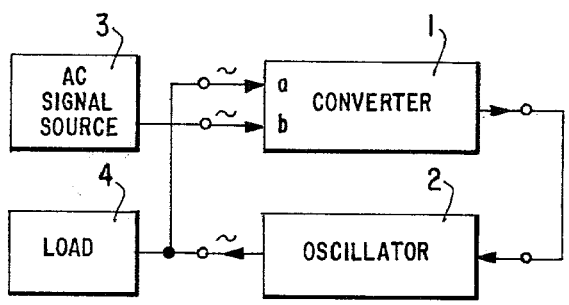

FIGS. 7 and 8 show arrangements in which the converter 1 and the oscillator 2 are connected into a loop in that the output signal of oscillator 2 is used as one a.c. input signal for the converter 1. While in the arrangement of FIG. 7 the output signal of oscillator 2 is fed to the converter input b as the second input signal, in the arrangement of FIG. 8 the oscillator output signal is applied to converter input a as the first input signal.

The loop formed in the arrangements of FIG. 7 and 8 produces a frequency feedback which has a stabilizing effect on the frequency of the oscillator output signal. While in the preceding arrangements the output signal of oscillator 2 is dependent upon both a.c. input signals, in the arrangements of FIGS. 7 and 8 the output signal of oscillator 2 is dependent only upon one input signal, i.e. the input signal originating from a.c. signal source 3. The arrangement of FIGS. 7 and 8 constitutes, for example, a frequency control arrangement. If instead of an oscillator a motor is provided, the arrangements of FIGS. 7 and 8 serve to regulate the rate of rotation of this motor.

Figure 9:
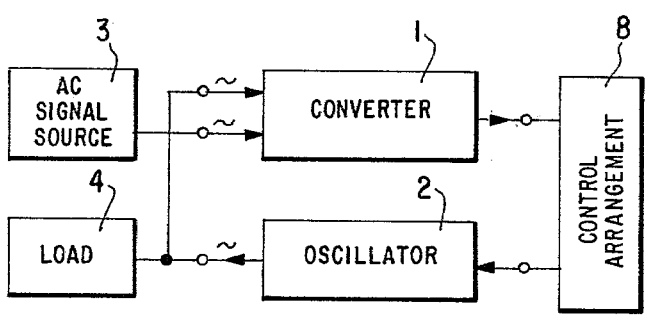

The arrangement of FIG. 9 differs from the arrangement of FIG. 8 in that in FIG. 9 the output of the converter 1 and the input of oscillator 2 are not connected directly together but instead a control arrangement 8 is connected therebetween. The control arrangement 8 permits additional control of the output signal of the oscillator. Since the control signal for the oscillator 2 coming from converter 1 and influenced by control arrangement 8 is essentially a d.c. signal, it is possible to influence this control signal by d.c. signals as well, which is effected by means of control arrangement 8.

This control arrangement 8 thus offers an additional control possibility, namely on the d.c. side.

Figure 10:
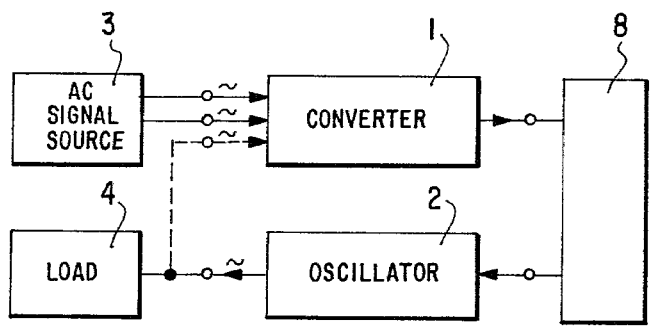

The arrangement of FIG. 10 differs from the arrangement of FIG. 9 in that, instead of only a single a.c. input signal, two a.c. input signals are fed to the converter from a.c. signal source 3. In the arrangement of FIG. 10 the loop may be open or closed, as shown by the dashed line. In the latter case, the output signal of oscillator 2 is the third input signal to converter 1.

In the arrangement of FIG. 11 the control arrangement $8^I$ includes a control source 9. The control source 9 may be a d.c. signal source, an a.c. signal source or a source which furnishes a composite signal having d.c. and a.c. components.

In the arrangement of FIG. 12 the control arrangement $8^{II}$ includes a control source 9 and an operational amplifier 10. The operational amplifier 10 receives, at its one input, the output signal from converter 1 and, at its other input, the output signal from control source 9. Thus, the resulting control signal applied to oscillator 2 is dependent upon the difference between the output signal from the converter and the signal from signal source 9. This difference signal is produced between the inputs of the operational amplifier 10 and is amplified by the operational amplifier and then fed to the oscillator 2 as a control signal.

The control arrangement $8^{II}$ of FIG. 12 makes it possible to connect the signal source 9 in a simple manner to a point at the circuit reference, or ground, potential. The arrangement of FIG. 12 has the advantage that the operational amplifier 10 increases the control effect of the output of converter 1 on oscillator 2. If in the arrangement of FIG. 12 the loop is closed by feeding the output signal from oscillator 2 to one input of converter 1, the frequency appearing at the output of oscillator 2 can produce equality between the output signal of converter 1 and the signal from signal source 9. In this case, there exists a linear dependency between the frequency of the output signal from the oscillator 2 and the signal from the signal source 9. During operation of such an arrangement, a nonlinearity which possibly exists between the control signal at the oscillator input and the output signal from the oscillator is eliminated.

The arrangement of FIG. 12 represents, for example, a frequency controllable oscillator which can be linearly controlled by the frequencies of the signals from a.c. signal source 3 as well as by the signal source 9. Such linear control is of great advantage, for example, for sweep generators. The arrangement of FIG. 12 is also particularly suited for frequency modulation of the output signal. Of course, the arrangement of FIG. 12 may also be controlled by only a single a.c. signal at the input of converter 1.

The arrangement of FIG. 13 differs from that of FIG. 12 in that the control arrangement $8^{III}$ has a second signal source 11 in addition to source 9. These two signal sources are generally independent of one another. This provides a further control possibility on the d.c. signal side.

In the above embodiments, the additional control signal which is fed to the control electrode 5 of converter 1 (FIGS. 5 and 6) as well as the control signals furnished by the control arrangement (FIGS. 10-13) can be influenced by acoustic, mechanical, optical and magnetic effects. This also applies for all of the arrangements to be described below.

The arrangement of FIG. 14 differs from that of FIG. 10 in that a second converter 12 is provided. This second converter 12 is fed, at its input, by a second a.c. signal source 13 while the output of the second converter 12 is connected with the control arrangement $8^{IV}$. The second converter 12 can be used to exert further influences on the output signal of oscillator 2 corresponding to a relationship between the frequencies of the two input signals to the second converter. The use of a second converter has the further advantage that adverse influences produced by the first converter, such as, for example, temperature dependency, operating voltage dependency and device tolerances, can be compensated by the action of the second converter. Such a compensation requires that the second converter have, as nearly as possible, the same electrical properties as the first converter. This is generally accomplished by giving the two converters identical circuit configurations.

FIG. 15 illustrates one example of achievement of such compensation. In the arrangement of FIG. 15 the output signal from the second converter 12 is fed to an operational amplifier or comparator 10, in control arrangement$^{IV}$. When the circuit is provided with a closed control loop by connecting the output of oscillator 2 to one input of converter 1, as indicated by a broken line, an output signal appears at the output of converter 1, as described in connection with FIG. 12, which is equal to the output signal from the second converter 12. Since the output signal from converter 12 is subjected to the same adverse influences as the output signal from the first converter 1, these adverse influences are compensated at the operational amplifier, or comparator, 10 since there the two signals are subtracted from one another.

Figure 16:
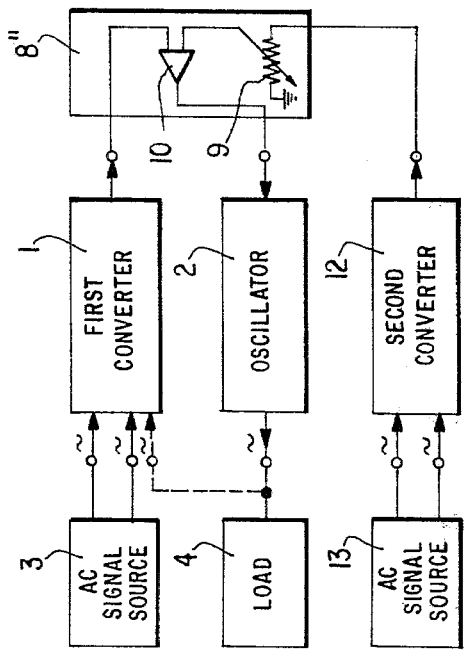
Figure 18:
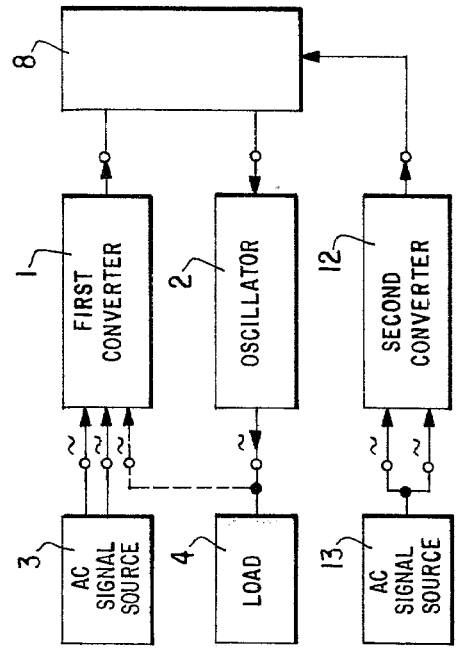

The arrangement of FIG. 16 differs from that of FIG. 15 in that the control arrangements $8^{III}$ and $8^{V}$, respectively, differ from one another. While in the control arrangement $8^V$ of FIG. 15 only an operational amplifier, or comparator, 10 is provided, the control arrangement of FIG. 16, as in FIG. 13, includes the additional signal sources 9 and 11. A further difference compared to the arrangement of FIG. 15 is that in the arrangement of FIG. 16 the second converter 12 actuates or controls the signal source 11 of control arrangement $8^{III}$. The other signal source 9 can of course also be actuated instead. The actuation of the signal source 11 is shown only symbolically in FIG. 16. FIG. 18, which will be described below, shows how such actuation can be effected.

Figure 17:
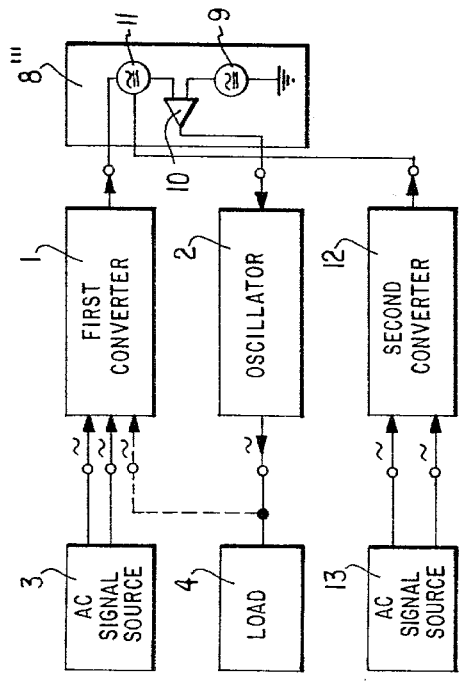

As shown symbolically in FIG. 17, the signal sources 9 and 11 can be further influenced, for example, mechanically by means of potentiometers, by digitally controlled voltage dividers, optically by means of photoresistors, or by magnetically controlled devices.

In the arrangement of FIG. 18 the signal source is a potentiometer 9 whose supply voltage is the output signal from the second converter 12. The arrangement of FIG. 18 constitutes a controllable frequency generator whose output frequency can be controlled as a function of the position of the movable top of potentiometer 9. A significant advantage of the arrangement of FIG. 18, when the output of oscillator 2 is connected to an input of converter 1 to form a closed loop, is that the output frequency of oscillator 2 is made linearly dependent on the voltage divider ratio of potentiometer 9.

Figure 19:
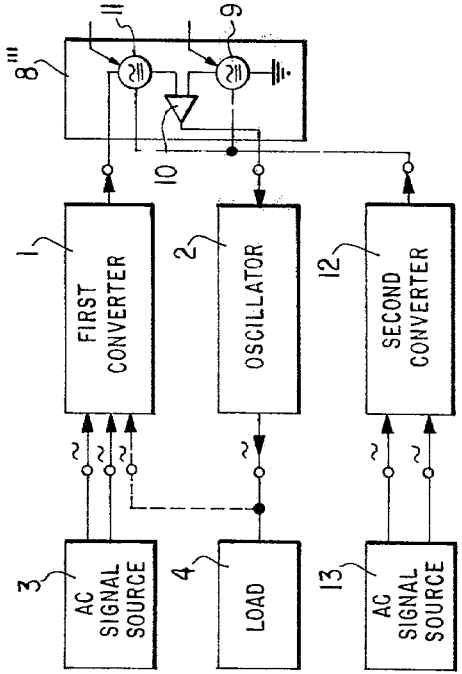
Figure 20:
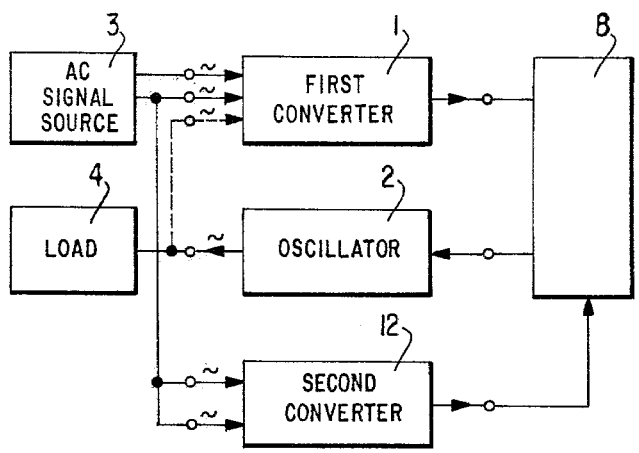
Figure 21:
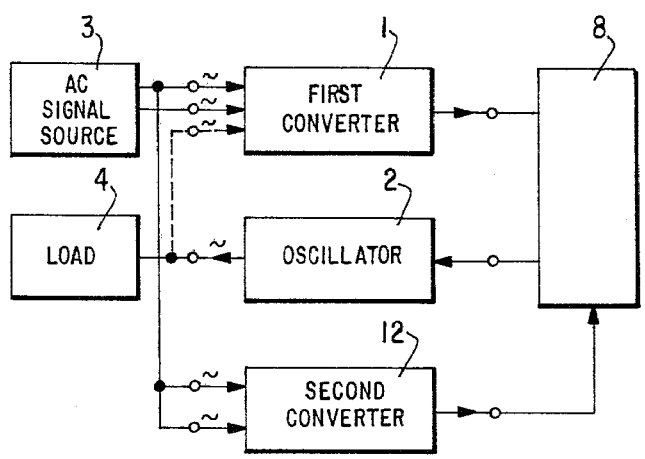

In the arrangement of FIG. 19 the two inputs of the second converter 12 receive the same signal from the a.c. signal source 13. In contradistinction thereto, in the arrangement of FIG. 20, this common signal does not originate from the a.c. signal source 13 but from one output of the a.c. signal source 3, which in addition also feeds one input of the first converter 1. The same also applies for the arrangement of FIG. 21, but here the common signal for the second converter 12 is obtained from the other output of the signal source 3.

Figure 22:
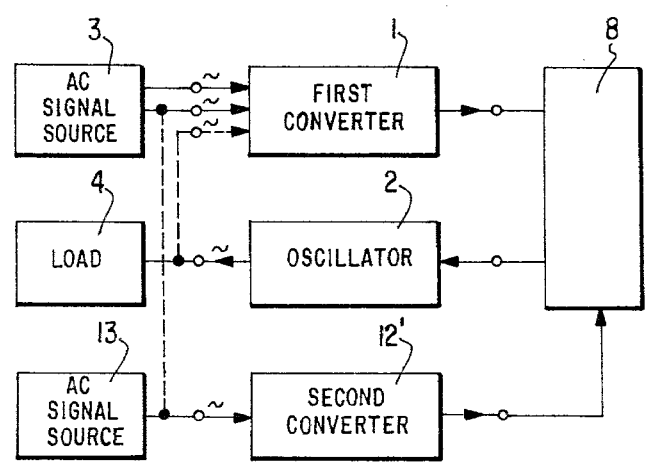

In the arrangement of FIG. 22, there is provided a second converter 12' which, in contradistinction to the previously used second converters, has only one input. This permits the converter structure to be simplified.

Figure 23:
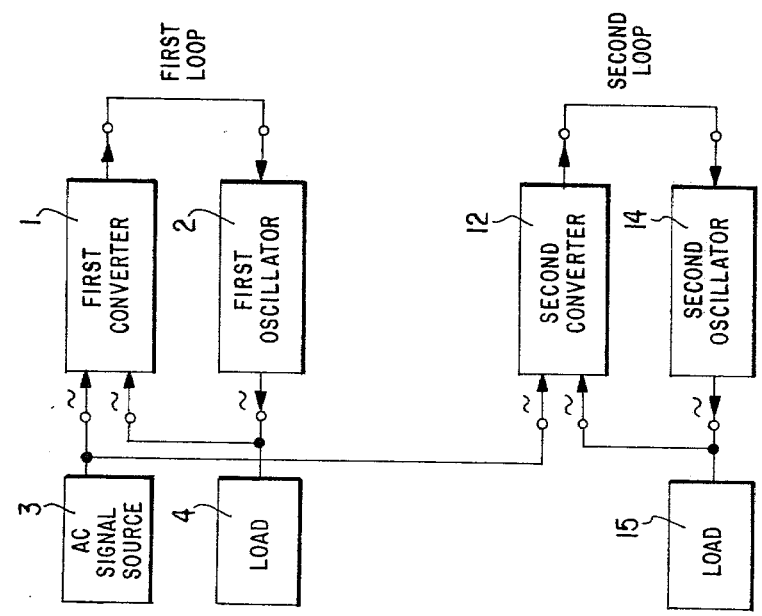

The arrangement of FIG. 23 differs from the previous arrangements in that it includes a second oscillator 14 driving a second load 15. This second oscillator can be combined with the second converter 12 in the same manner that the first oscillator 2 is combined with the first converter 1. The arrangement of FIG. 23 thus has two closed-loop converter/oscillator systems, each system having a converter and an oscillator. Instead of only two converter/oscillator systems, a plurality of converter/oscillator systems can of course be provided. By appropriately designing the individual converter-/oscillator systems, as well as by appropriately linking these systems together, it becomes possible, for example, to produce frequency summing members and frequency subtracting members, frequency followers, frequency dividers and frequency multipliers. The arrangement can also operate as a controlled signal frequency reference driving two independent loads 4 and 15.

In the arrangement of FIG. 23, both loops are linked together in that converter 1 of the first loop and converter 12 of the second loop both received an a.c. input signal from the common a.c. signal source 3.

Figure 24:
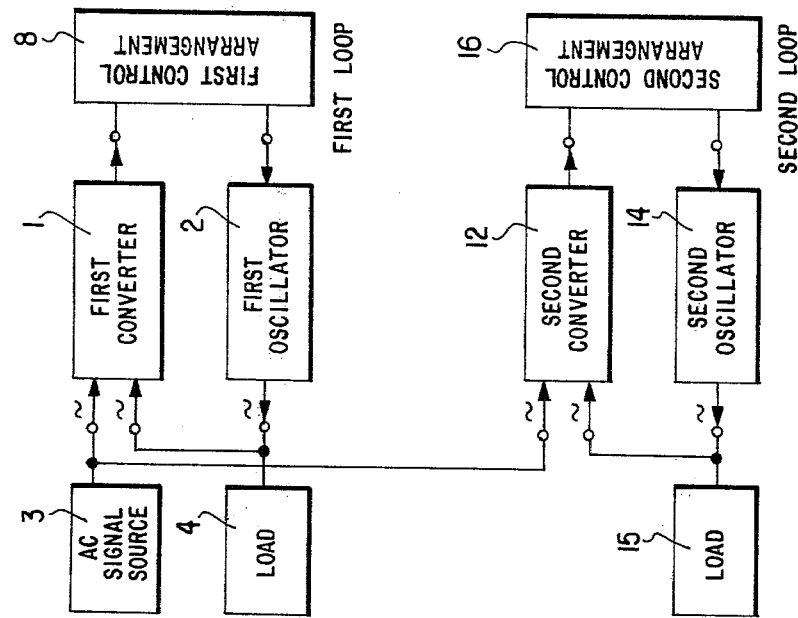

In the arrangement of FIG. 24, in contradistinction to that of FIG. 23, a first control arrangement 8 is provided between the first converter 1 and the first oscillator 2 and a second control arrangement 16 is connected between the second converter 12 and the second oscillator 14. The control arrangements 8 and 16 provide the same advantages as described above with reference to the arrangement of FIG. 9. The linkage between the two loops is the same as in the arrangement of FIG. 23. As in the preceding arrangements, the loads 4 and 15 are separate signal receivers. Of course, instead of two loads, there may be only a single load.

In the arrangement of FIG. 24, the first and second oscillators 2 and 14 can be set to produce output signals at respectively different frequencies under control of a constant frequency signal from a.c. signal source 3 and these different frequency signals can be independently frequency modulated by the control arrangements 8 and 16.

Figure 25:
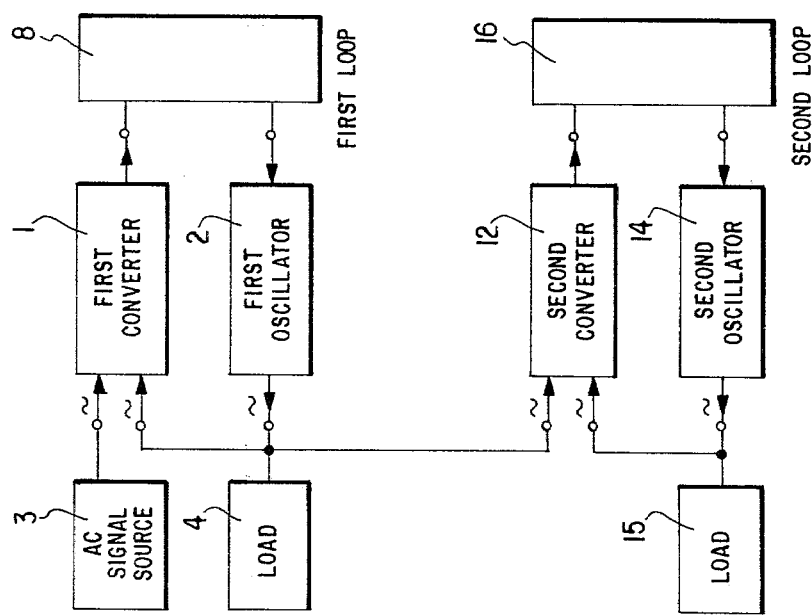

In the arrangement of FIG. 25, the linkage between the two loops is different from that of FIGS. 23 and 24 in that the output signal from the first oscillator 2 of the first loop is the one input signal to the second converter 12 of the second loop as well as being an input signal to converter 1. In the arrangement of FIG. 25, the frequency of the output signal from first oscillator 2 is dependent only upon the frequency of the a.c. signal source 3 and the control signal or signals from control arrangement 8. The frequency of the output signal of the second oscillator 14, however, is dependent on the frequency of the output signal from the first oscillator 2 and on the control signal or signals from the second control arrangement 16. Since the frequency of the output signal from the first oscillator 2 is dependent upon the frequency of the signal from the a.c. signal source 3 and upon the control signal or signals from the first control arrangement 8, the frequency of the output signal from the second oscillator 14 is dependent upon the signals from the a.c. signal source 3, the first control arrangement 8 and the second control arrangement 16.

Due to the linkage between the two loops provided in the arrangement of FIG. 25, it will occur that if, for example, the output signal from the first oscillator 2 is a frequency modulated signal, this frequency modulated signal is supplied to the second converter 12 so that the output signal of the second oscillator 14 is likewise frequency modulated. Independently of this, frequency modulation of the second oscillator may also be effected, under control of the second control arrangement 16. Such frequency modulation, however, would not affect the first loop.

Figure 26:
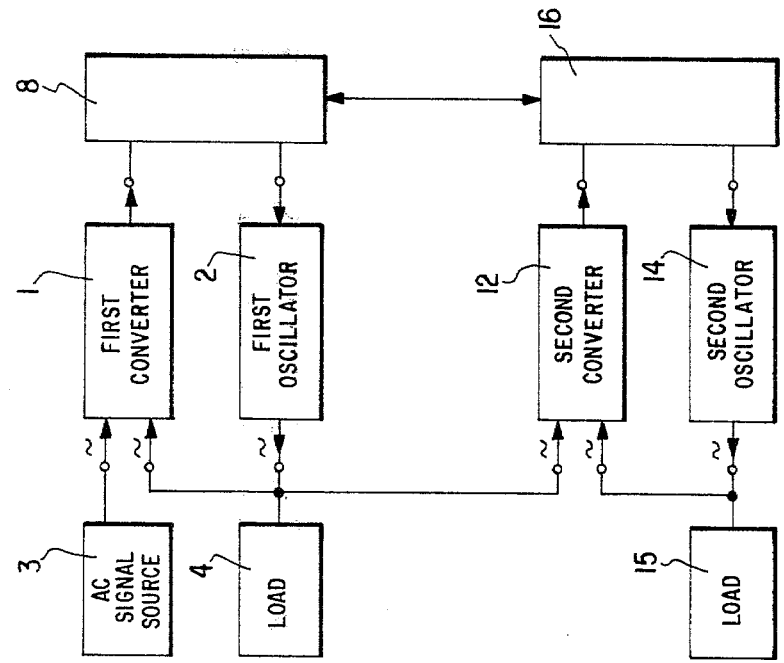

The arrangement of FIG. 26 differs from the arrangements of FIGS. 24 and 25 in that the first control arrangement 8 and the second control arrangement 16 are additionally linked together. This linkage is effected, for example, in that the control signals of the first control arrangement influence the control signals of the second control arrangement, and vice versa.

Arrangements 8 and 16 can be linked together in a manner to effect signal transmission unidirectionally, in either direction, therebetween. The linkage can be established between various points in each control arranged to achieve different relationships. For example, if each of the control arrangements 8 and 16 were constituted by the circuit 8''' of FIG. 16, source 9 could be removed from one of those circuits and the source 9 of the other circuit could be connected to one input of the comparator 10 in each control arrangement. In other words, the linkage would be between the output of source 9 of the other circuit and the one input of comparator 11 of the other circuit. This would enable both oscillators 2 and 14 of the module of FIG. 26 to track one another with respect to variations in the control signal from the single source 9. By employing additional components, such as voltage multipliers, dividers or function generators, in such a linkage, the two oscillators could be caused to track one another according to various selected functions.

Figure 27:
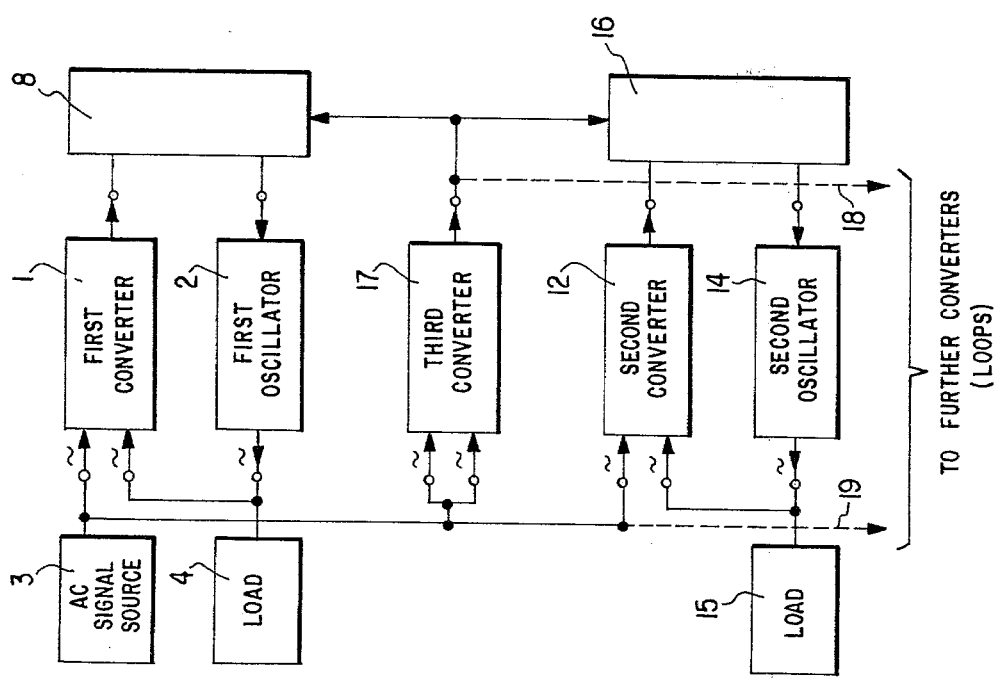

The arrangement of FIG. 27 differs from the arrangements of FIGS. 25 and 26 essentially in that a third converter 17 is provided to compensate adverse influences. This third converter 17 has the same compensating function as the second converter 12 of the arrangements of FIGS. 17 to 22. This function has been described in connection with FIG. 15. The output signal from the third converter 17 actuates, or controls, the first and second control arrangements 8 and 16 and serves as the reference signal for the first and second loops. If further loops are provided, these loops may also be actuated by the reference signal and thus be stabilized. This is indicated by the broken line 18. The broken line 19 indicates that such further loops may be fed by the a.c. signal source 3.

Figure 28:
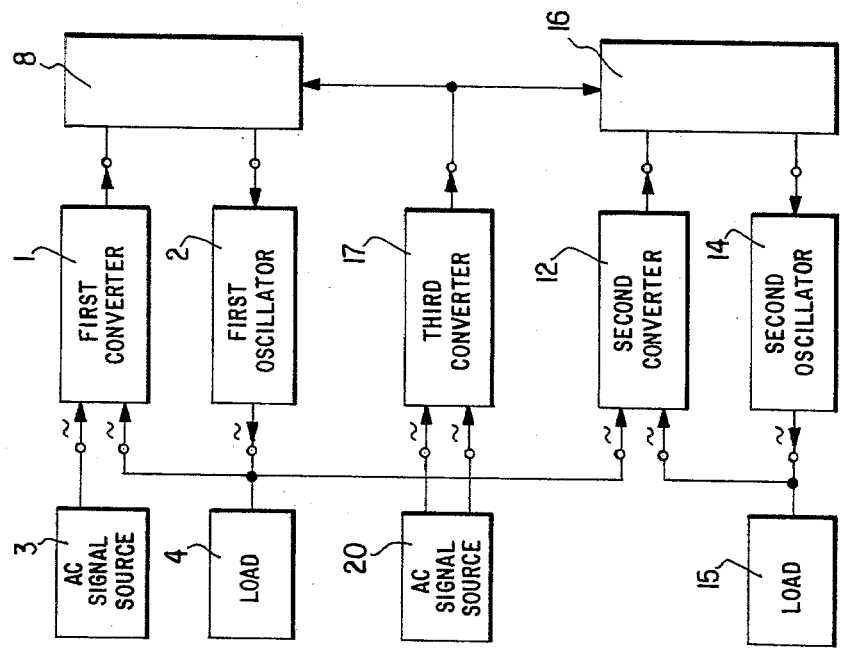

While in the arrangement of FIG. 27 the two inputs to the third converter 17 are fed by a common signal originating from the a.c. signal source 3, the two inputs to the third converter 17 in the arrangement of FIG. 28 are supplied with respectively different signals which are furnished by a further a.c. signal source 20.

FIG. 29 shows a circuit which differs from that of FIG. 24 in that more than two loops can be provided and control arrangements 8, 16, etc., can be linked together.

While in the arrangement of FIG. 28 the third converter 17 was influenced only by signals from the a.c. signal source 20, the converter 17 of the arrangement of FIG. 30 is additionally influenced by a third control arrangement 21 connected to control electrode 5. As shown in FIG. 30, the converter 17 forms a control loop together with the third control arrangement 21. This control loop includes an operational amplifier, or comparator, 23, one input of which is connected to the output of converter 17 and the other input of which receives a signal from a signal source 22. A regulation is effected in such a way that the output signal from converter 17 becomes equal to the control signal from the signal source 22.

The control loop 17, 21 operates as follows: If the output signal from converter 17 experiences an undesired change due to adverse influences such as, for example, a change in the temperature or operating voltage, a comparison of the output signal from converter 17 with the control signal from signal source 22 produces a signal which, after amplification by the operational amplifier, appears at the control input 5 of the converter 17 to counteract the undesired change so that the undesired change at the output of converter 17 is compensated. This results in a converter output signal which is dependent only on the control signal of the control source 22, and which at least substantially coincides with the control signal from the signal source 22. The signal at the control electrode 5 of the third converter 17 which compensates the adverse influences is also fed to the control electrodes 5 of the first converter 1 and of the second converter 12 so that their corresponding adverse influences can also be compensated. This requires, however, that all converters have as many properties in common as possible which is accomplished, for example, by giving the converters an identical design.

The advantage provided by the manner of effecting compensation in the arrangement of FIG. 30 can best be explained by way of a comparison with the arrangement of FIG. 12. If in the arrangement of FIG. 12 the ambient temperature changes so that the converter would furnish a lower output signal, the control signal for oscillator 2 would change correspondingly since the lower output signal from converter 1 is compared in operational amplifier, or comparator, 8 with a constant signal value from signal source 9. A change in the control signal for the oscillator, however, inevitably produces a change in the oscillator frequency. This change in oscillator frequency is undesirable since the object is, of course, to produce an oscillator frequency which is independent of adverse influences. Such undesirable change in the oscillator frequency, however, does not occur in the arrangement of FIG. 30 because the control loop formed by the third converter 17 and the third control arrangement 21 prevents changes in the oscillator frequency due to such adverse influences. The arrangement of FIG. 30 makes possible external actuation of the various loops, for example by means of signal sources contained in the control arrangements, without the above-mentioned adverse influences having any adverse effect.

Figure 31:
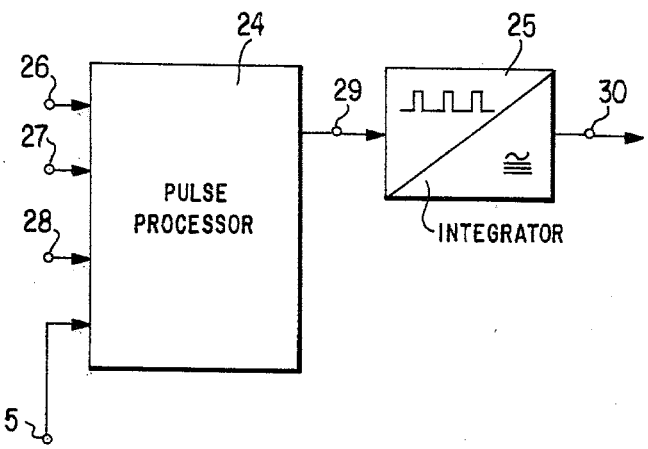
FIG. 31 is a block circuit diagram of one embodiment of a converter which can be used in the modules of FIGS. 1–30.

FIG. 31 is a block circuit diagram of one embodiment of a converter which can be advantageously used in the modules described above. In its simplest form, such a converter includes a pulse processor 24. In the arrangement of FIG. 31 an integrator 25 follows the pulse processor 24. The integrator 25 would not be required if no integration of the output signal from the pulse processor is required. The d.c. output signal from integrator 25 has an amplitude proportional to the duty ratio, or pulse length/pulse repetition period, of the output pulse train at output 29 of processor 24.

The pulse signals to be processed are applied to the inputs 26, 27 and 28 of the pulse processor. The output signal produced at the output 29 of the pulse processor is smoothed by the integrator 25 and is available as the output signal at output 30.

Control input 5 serves to supply a control signal for controlling the pulse processor 24.

Figure 32:
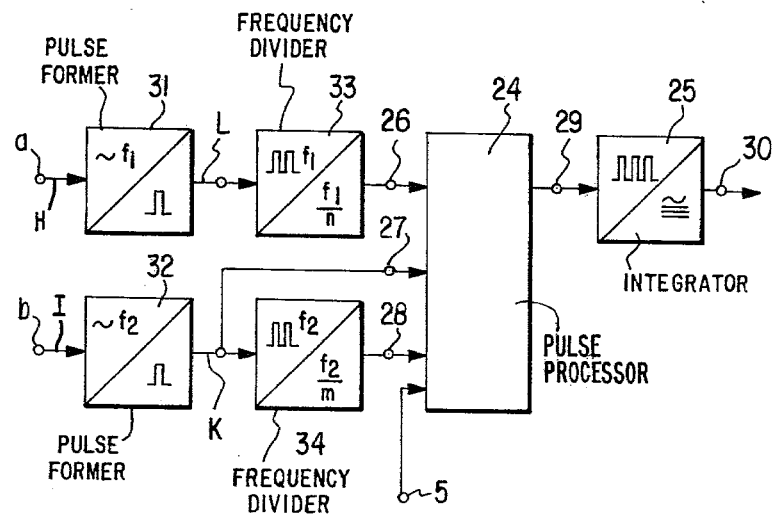
FIGS. 32 and 33 are block circuit diagrams of further embodiments of converters according to the invention.

Compared to the converter of FIG. 31, the converter of FIG. 32 has two additional pulse formers 31 and 32, each converting an a.c. input signal into a pulse train whose repetition rate equals the input signal frequency, as well as two frequency dividers 33 and 34. These additional members are required if pulse signals for the pulse processor 24 are not available right from the start but must be derived from a.c. signals. In the embodiment of FIG. 32, the converter is designed to receive two a.c. input signals. With more than two a.c. input signals, a correspondingly greater number of pulse shapers and frequency dividers are required. For certain applications, the frequency dividers are preferably designed to have a programmable dividing ratio.

In the converter of FIG. 32, the first a.c. input signal at frequency $f_1$ which is fed to the input a of the pulse shaper 31 is converted by this pulse shaper into a corresponding pulse signal at a repetition rate $f_1$. The same applies for the second a.c. input signal at frequency $f_2$ at the input b of pulse shaper 32, which is converted by this pulse shaper into a corresponding pulse signal at a repetition rate $f_2$. Since the pulse processor 24 is able to optimally process only a certain frequency range or a certain frequency relationship between the input signals, the two frequency dividers 33 and 34 are required in case the frequencies $f_1$ and $f_2$ of the a.c. input signals are too high or have a relationship which is unsuitable for processing in the pulse processor. The pulse signals furnished by frequency dividers 33 and 34 at frequencies $f_1/n$ and $f_2/m$ are fed to the inputs 26 and 28 of the pulse processor 24. The third input 27 of the pulse processor 24 receives the output signal from pulse shaper 32.

The output signal produced by the pulse processor at its output 29 is fed, as already explained with reference to FIG. 31, to the input of the integrator 25. The output 30 of the integrator furnishes a smoothed output signal. The fourth input 5 is identical to the control input 5 of the preceding arrangements.

Figure 33:
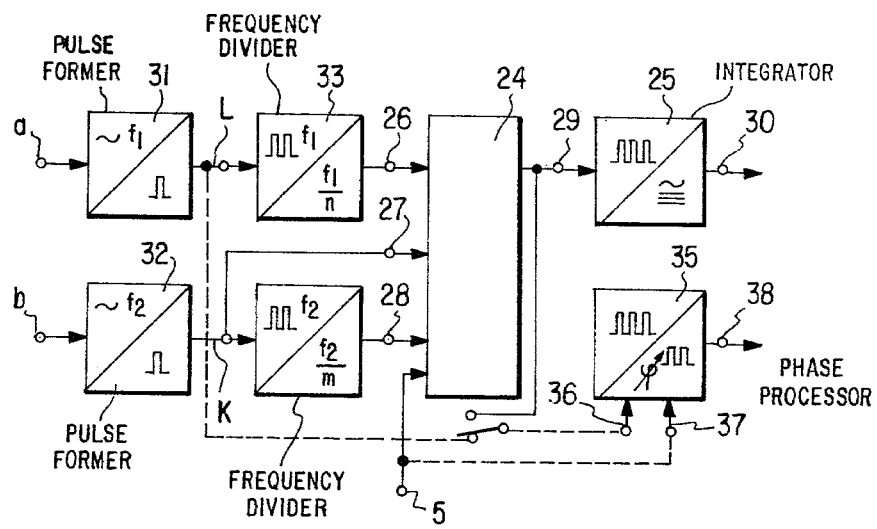

For an expanded range of application, the converter of FIG. 33, in a special case, is additionally provided with a phase processor 35. In the converter of FIG. 33 this phase processor has two inputs 36 and 37 and one output 38. The input 36 of the phase processor 35 receives the signal to be controlled. In the embodiment of FIG. 33, this is the output pulse signal from pulse shaper 31 at the repetition rate $f_1$. Input 37 receives the control signal which, in the embodiment of FIG. 33, comes from the control input 5 for the pulse processor 24. The phase processor 35 furnishes, at its output 38, an output signal which has a change in phase compared to the signal to be controlled at input 36 corresponding to the controlling effect of the control signal at input 37.

As shown in FIG. 33, the signal input to processor 35 is connected by a switch to the output of pulse former 31. When the switch position is changed, the signal input to processor 35 will receive the pulse train at the output of pulse processor 24. It is also possible, for specific circuit applications, to supply the signal input 36 of phase processor 35 with the pulse train appearing at any selected point within pulse processor 24, or with the signal at the output of any one of elements 32, 33 or 34.

The pulse shapers and frequency dividers used in the converters, as well as the integrator and the phase processor, can all be constituted by well-known, commercially-available circuit components.

The pulse processors according to the invention are designed so that one input pulse signal controls the pulse rate of its output signal while the other input pulse signal controls the width of each pulse of its output signal. The one input signal influences the pulse rate of the output signal of the pulse processor and the pulse width of the output signal of the pulse processor is proportional to the period of the other input signal. Therefore, the d.c. component of the output signal of the pulse processor is directly proportional to the frequency, or repetition rate, of the one input signal and inversely porportional to the frequency, or repetition rate, of the other input signal. Since the period of the input signal determining the pulse width is inversely proportional to the repetition rate thereof, the value of the d.c. component of the pulse processor output signal will be inversely proportional to the repetition rate of the input signal determining the pulse width.

A pulse processor having the above-mentioned capability can be constituted, for example, by a combination of three circuit units which are, for example, flip-flops having the characteristics to be listed below or by a combination of units with the characteristics to be described below. Two of the three flip-flops are identical to one another and can be so-called D-flip-flops which have the characteristic that a rise in the edge of a clock signal at the clock input transfers a signal value present at the data input D to the output Q of the flip-flop. Each flip-flop must further operate such that a positive pulse at its reset input sets the flip-flop to the state in which a logic zero ("0") is present at its output Q and a logic one ("1") is present at its output Q. In the example to be described below, for example, the positive edge of a clock signal actuates the signal transfer and a positive pulse of the reset signal effects resetting of the flip-flop. The third flip-flop is a so-called JK-flip-flop whose operating behavior is such that a pulse train at half the frequency of its clock signal appears at its output if a corresponding logic "1" signal is present at the J and K inputs, and a constant signal appears at its output if a logic "0" signal is present at the J and K inputs.

Figure 34:
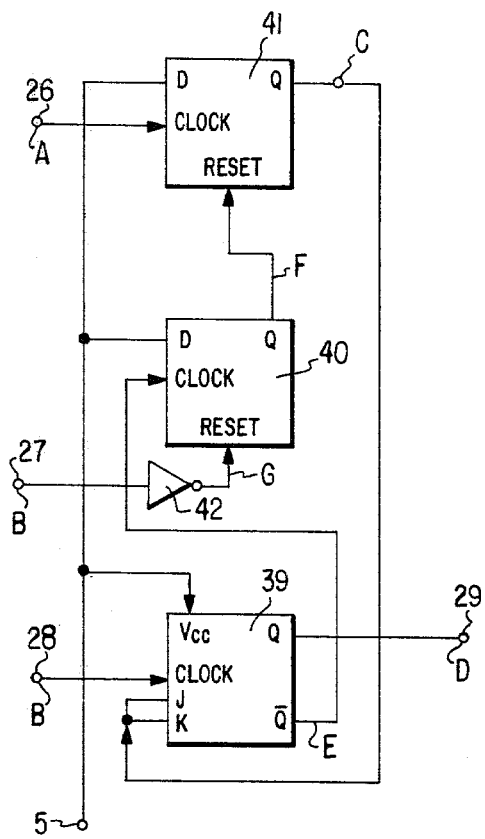
FIG. 34 is a circuit diagram of one embodiment of the pulse processor of the converters of FIGS. 31–34.

FIG. 34 shows an embodiment of such a pulse processor according to the invention. The pulse processor of FIG. 34 includes as mentioned above, two D-flip-flops 40 and 41, a JK-flip-flop 39, and an inverter 42. In the pulse processor of FIG. 34 the flip-flop 39 is a known flip-flop of the JK-master-slave type, while the other two flip-flops 40 and 41 are known D-flip-flops. One input pulse signal for the pulse processor is fed to the clock input of flip-flop 39. The two inputs J and K of the flip-flop 39 are connected with the direct output Q of flip-flop 41. The inverting output Q of the flip-flop 39 is connected with the clock input of the flip-flop 40. The direct output Q of the flip-flop 40 is connected with the reset input of the flip-flop 41. The direct output Q of the flip-flop 39 is connected to the output 29 of the pulse processor. The D inputs of flip-flops 40 and 41 as well as the $V_{CC}$ input of the flip-flop are connected together to control input 5, which in this embodiment provides a constant supply voltage. The reset input of the flip-flop 40 is connected to the output of inverter 42.

Figure 35:
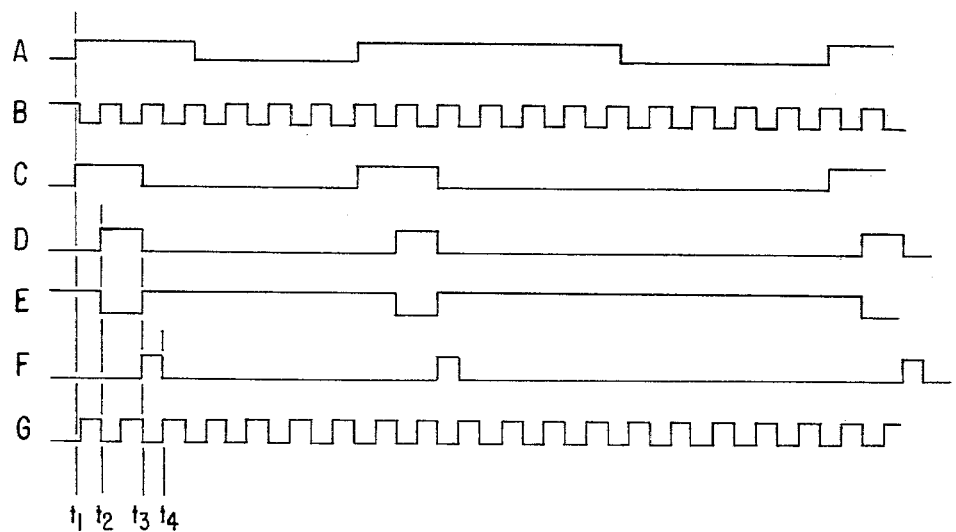
FIG. 35 is a waveform diagram illustrating the operation of the circuit of FIG. 34.

FIG. 35 illustrates the operation of the circuit of FIG. 34, with each signal waveform representing the signal at a point in the circuit of FIG. 34 identified by the same letter. The input pulse signals A and B shown in FIG. 35 already have such a frequency relationship that they can be applied directly to the inputs of the pulse processor of FIG. 34 to produce at its output the desired frequency dependency of its output signal relative to the input signals.

If the pulse signal A of FIG. 35 is applied to the input 26 of the flip-flop 41 of FIG. 34, the positive edge of this signal appearing at time $t_1$ causes the signal C at the direct output Q of flip-flop 41 to assume the level present at its input D and corresponding to the logic level "1". This also sets the JK inputs of flip-flop 39 to the logic level "1" and flip-flop 39 is enabled for binary frequency division of its clock signal, represented by signal B in FIG. 35. If now a positive edge of signal B arrives at the clock input 28 of flip-flop 39, the output Q of this flip-flop, which provides signal D, is set, at time $t_2$, to the logic level "1". This state continues until the next positive edge of the clock signal B arrives at time $t_3$.

When at time $t_3$ a negative edge appears at the output Q of flip-flop 39, a corresponding positive pulse rise simultaneously appears in signal E at its inverting output Q, which signal is fed to the clock input of flip-flop 40 and thus produces the logic level "1" in signal F at the direct output Q of flip-flop 40. This pulse at the direct output Q of flip-flop 40 is fed to the reset input of flip-flop 41 and causes the logic level at the direct output Q of flip-flop 41 to be set to logic zero ("0"), and the direct output of flip-flop 41 to be set to logic zero ("0").

Since the direct output Q of flip-flop 41 is connected to both the J-input and the K-input of flip-flop 39, setting of the logic level at the output Q of flip-flop 41 (signal C) to zero causes flip-flop 39 to be likewise set to zero at its direct output Q (signal D).

The described pulse sequence is repeated whenever a new positive pulse edge in signal A arrives at the clock input of flip-flop 41.

The above-described logic linkage has the result that, as shown in FIG. 35, every individual pulse in signal A has associated with it only one pulse in signal D, which is independent of the length of the signal A pulse. FIG. 35 further shows that the width of each pulse in signal D is equal to the period of signal B since both the start and stop of each signal D pulse is controlled by successive positive edges of signal B. In the embodiment of FIG. 35, the period of signal B is equal to $t_3-t_2$.

The inverter 42 of the pulse processor of FIG. 34 serves the purpose of inverting the signal fed to input 27, which according to one connection possibility is signal B and of then feeding the inverted signal G to the reset input of flip-flop 40. Signal G acts to promptly reset flip-flop 40 while assuring that each positive pulse in signal F will be sufficiently long to reset flip-flop 41. For certain types of semiconductor construction, the magnitude of the signal applied to input 5 can be varied over a limited range to control the pulse height of the pulse processor output signal present at output 29. Such a signal thus constitutes a further control of the d.c. component of this output signal.

Figure 36:
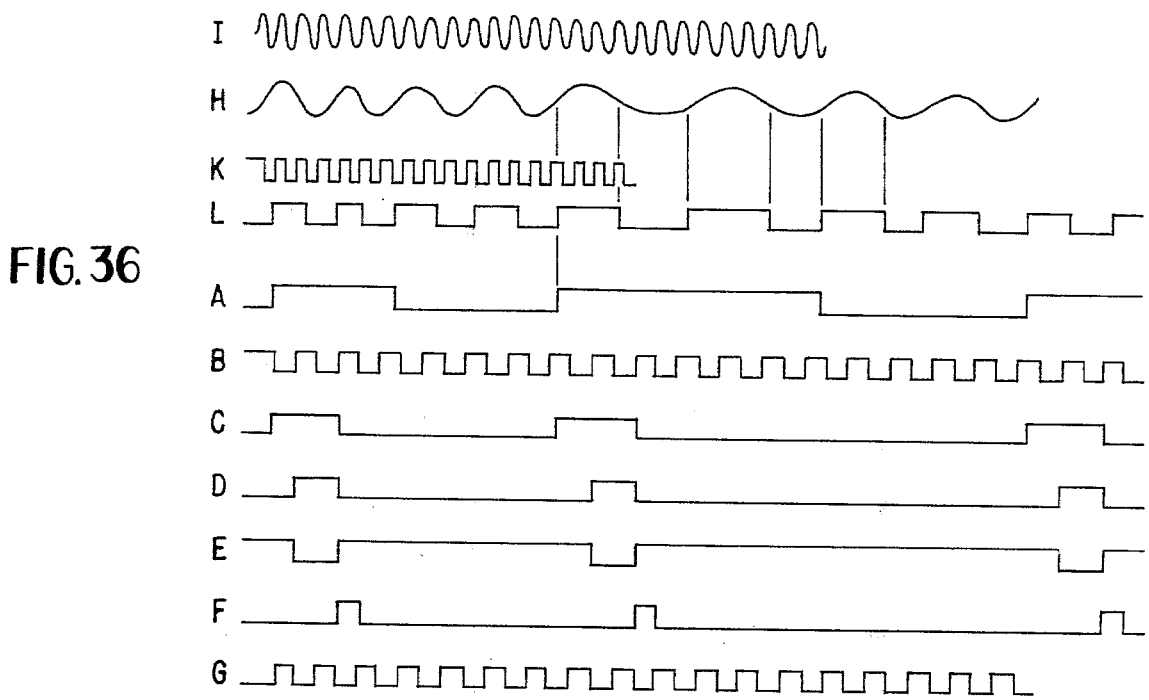
FIG. 36 is a diagram similar to that of FIG. 35 illustrating the operation of the converter of FIG. 32.

FIG. 36 presents a series of signal waveforms, in addition to the signals A–G of FIG. 35, which were produced by pulse shaping and frequency division. The additional waveforms in FIG. 36 include a sinusoidal signal H representing the first a.c. input signal at input a of the converter of FIG. 32 and a sinusoidal signal I representing the second a.c. input signal at the input b of the converter of FIG. 32. The corresponding outputs of pulse formers 31 and 32 are represented by waveforms L and K, respectively. It will be seen that signal A contains a pulse train at one-fourth the repetition frequency of signal L, while signal B contains a pulse train at one-half the frequency of signal K. Thus, the illustrated signal waveforms relate to an embodiment of the circuit of FIG. 32 in which the frequency dividers have division ratios corresponding to n=4 and m=2.

Figure 37:
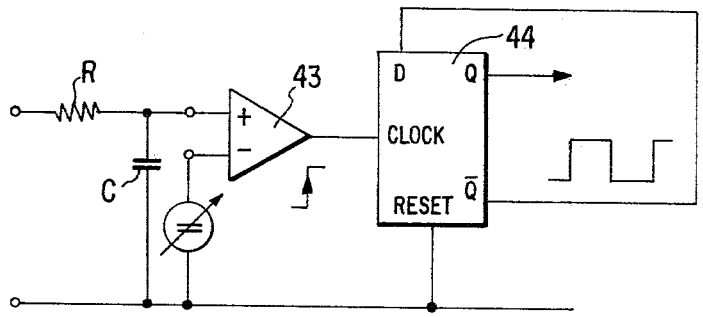
FIG. 37 is a circuit diagram of one embodiment of the phase processor of FIG. 33.

One advantageous embodiment of the phase processor of FIG. 33 is shown in FIG. 37 and includes an RC member and a comparator 43. The RC member serves the purpose of converting a square wave pulse signal fed to the input of the phase processor corresponding to input 36 of FIG. 33 into an approximately triangular pulse signal. Comparator 43 effects a comparison between this triangular-shaped pulse signal and an externally applied control signal, supplied to inputs of the comparator, and the voltage at its output switches value in one direction whenever the sawtooth signal voltage exceeds the control signal voltage. If, however, the sawtooth signal voltage is lower than the control signal voltage, the comparator output voltage is switched in the other direction. The comparator output signal is delivered to the clock input of a D flip-flop 44 forming part of the phase processor. The inverting output Q of D-flip-flop 44 is connected to its D input so that the flip-flop produces at its direct output Q a pulse signal whose phase is determined by the control voltage across the comparator and whose frequency is one-half that of the square wave input pulse. The externally applied control signal is furnished by a voltage source which could be controlled by the signal at terminal 37 of FIG. 33, or which could be a source of the voltage supplied to terminal 37.

Figure 38:
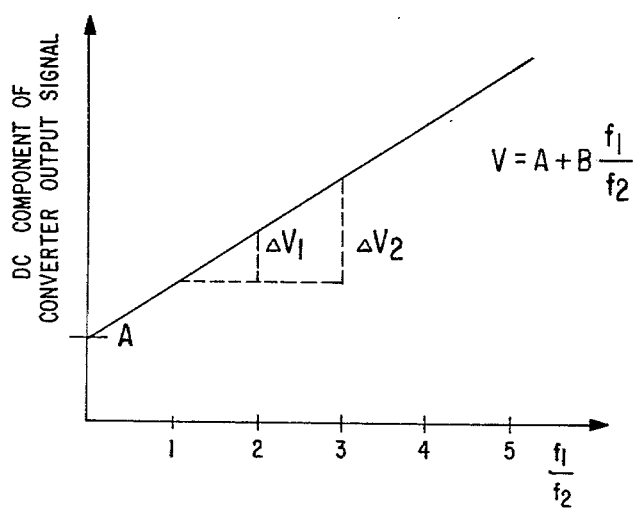
FIG. 38 is a signal diagram illustrating the operation of converters according to the invention.

FIG. 38 shows the relationship between the d.c. component of the output signal from a converter according to the invention in dependence on the relationship $f_1/f_2$, where $f_1$ is the frequency of the first a.c. input signal and $f_2$ is the frequency of the second a.c. input signal. According to FIG. 38, the relationship $$V=A+B\cdot(f_1/f_2)$$

defines the d.c. component V of the converter output signal. The constant A results from the intersection of the characteristic with the ordinate. The constant B corresponds to the slope of the characteristic. The frequency $f_1$ is the frequency of the first a.c. input signal, the frequency $f_2$ is the frequency of the second a.c. input signal.

As is evident from FIG. 38 and also from the relationship $$V=A+B\cdot(f_1/f_2)$$

there exists a linear relation between the value of the d.c. component V and the frequency relationship $f_1/f_2$. This is equivalent to the fact that the d.c. component is proportional to the relationship $f_1/f_2$. This relationship can generally be achieved over a wide frequency range. Even if small deviations from the straight line of FIG. 38 should occur, the invention offers significant improvements compared to prior art arrangements. As is evident from the relationship $V=A+B\cdot(f_1/f_2)$, the dependency of the d.c. component upon the frequency relationship remains the same even if variations should occur in the difference between $f_1$ and $f_2$.

FIG. 39 shows the output pulse signal 45 from a pulse processor according to the invention. By integrating the pulse signal 45, the substantially triangular waveform signal 46 is obtained. This signal exhibits fluctuations which depend on the time constant or integration smoothing. Ideal smoothing would result in the signal 46a shown by a broken line representing the d.c. component of the output signal which has been mentioned throughout this description. This d.c. component could be indicated, for example, by a moving coil instrument which is known to provide an average indication.

FIG. 40 shows an oscillator tuning circuit according to the invention. Oscillator tuning circuits are used, for example, in receiver circuits, such as, for example, radio and television receivers and recently electronic tuning has become increasingly common. In electronic tuning processes, however, which are effected, for example, by means of varactor diodes, there exists a nonlinear relation between the control voltage and the oscillator frequency. For this reason it is not possible to employ a linear frequency scale for a display of the control voltage for the tuning diode. In the known oscillator tuning circuits the great temperature dependency of the varactor diodes must be compensated by complicated compensation circuits.

The oscillator tuning circuit of FIG. 40 does not have the above-mentioned drawbacks. In FIG. 40, a converter 47 forms a control loop with a control arrangement 48 and an oscillator 49.

Converter 47 receives two input signals, i.e. a reference signal from reference source 50 and the output signal from oscillator 49. The frequency at which oscillator 49 is to operate is controlled by an output signal from arrangement 48. The oscillator signal feeds the mixer stage of the receiver, forming part of load 4, in a known manner. The control arrangement 48 of FIG. 40 includes a control source 51a connected between the output of converter 47 and one input of an operational amplifier, or comparator, 54 so that the output signal from source 51a is controlled by the output signal of converter 47. The output signal from source 51a is supplied to one input of amplifier 54. Control arrangement 48 further includes an adjustable control source 51b whose output is connected to the other input of amplifier 54, and a potentiometer 51 whose movable tap is connected to control the signal provided by source 51b. With a high gain for amplifier 54, oscillator 49 will be controlled in a manner which tends to make the two input signals to amplifier 54 equal.

The circuit of FIG. 40 further includes a second converter 47a which is electrically identical to converter 47. Both inputs of converter 47a are connected to the output of reference signal source 50, while the output of converter 47a is connected to one end of potentiometer 51, the other end of that potentiometer being connected to ground. The output signal from converter 47a thus provides a reference, or base, voltage for potentiometer 51. In a modified embodiment of the invention, potentiometer 51 could be replaced by an active device, such as an operational amplifier or digital voltage synthesizer, having a linear voltage response characteristic. In addition, the element 51 can be provided with one or more adjustment inputs, such as the shaft for displacing the movable tap of a potentiometer or a set of selective switches for a voltage synthesizer, to provide an additional linear or non-linear control over the value of the output signal from element 51.

The output signal from device 54, which can typically be an operational amplifier having an extremely high gain, will control oscillator 49 in such a manner as to tend to make the output signal from source 51a equal to the output signal from source 51b. When this relationship is achieved, the frequency of the output from oscillator 49 will be related to the frequency of the signal from source 50 in a manner determined by a selected relationship between the voltage response characteristics of sources 51a and 51b and the setting of element 51.

The circuit shown in FIG. 40 operates to compensate for negative effects caused by, for example, thermal drift of the components of either converter, as well as adverse influences resulting from supply voltage and/or current instabilities and parasitic effects experienced by the components of the converters. Such compensation is achieved by creation of a properly adjusted relative common mode rejection of the signals delivered by the outputs of the two converters 47 and 47a.

The provision of the two control sources 51a and 51b in control arrangement 48 provides further possibilities for effecting additional control over parasitic influences, such as voltage level shifts occurring within the converters and/or signal deviations introduced by control member 51, itself. The two control sources 51a and 51b can also be operated to perform optional frequency shifting functions, such as to effect an AFC action in radio receivers, or to effect a frequency band shift.

Signal sources 51a and 51b, like similar sources in the control arrangements of other embodiments illustrated herein, can be constituted by passive components such as single resistors or resistor networks, and/or by active components such as batteries or operational amplifiers. Preferably, they are constructed to compensate for the effects of negative influences, such as long term drifts or long duration oscillatory variations in the characteristics of the associated converters.

In the case where there occurs a deviation of the oscillator frequency from the desired value as a result of the adverse influences such as, for example, temperature influences or changes in the operating voltage, this deviation also produces a deviation from the desired value in the d.c. component at the output of converter 47 which, when compared with the control voltage from source 51b, results in a difference voltage other than zero between the inputs of amplifier 54. This difference voltage acts to change the oscillator output frequency in such a direction that the undesired deviation is compensated by a self-regulating effect. In this manner, adverse influences, such as temperature and aging of the components of the oscillator, are compensated or made ineffective.

The oscillator 49 of FIG. 40 can be constituted by the basic LC oscillator circuit with varactor diode tuning shown in FIG. 41. In that circuit, oscillation is produced by transistor T and the frequency of the generated oscillation corresponds to the resonant frequency of the resonant circuit defined by elements L and C. The frequency of the oscillator output signal, appearing at terminal 53, is controlled by varying the capacitance of the varactor diode D by means of the control voltage applied at terminal 52. In the circuit of FIG. 40, oscillator output 53 is connected to one input of converter 47 and oscillator control input 52 is connected to the output of amplifier 54. According to other embodiments of the invention, oscillator 49 could be constituted by a controlled multivibrator or an RC circuit.

However, the circuit shown in FIG. 40 is not suited for direct scale frequency indication. With changes in the intermediate frequency and with an identical receiving frequency range, it would be necessary each time to set a different voltage relationship for the signal source.

Both of these drawbacks are overcome by the circuit shown in FIG. 42. In this circuit, a second converter 55 is used to produce a reference voltage which actuates the first control arrangement 48 via a second control arrangement 56. The second converter 55 effects compensation for the negative influences. The second control arrangement 56 includes a known adder circuit 57 which adds the voltages at nodes, or points, 58 and 59 and feeds the sum to the first control arrangement 48. When a constant voltage is present at point 58, the voltage at point 59 changes with the position of the movable tap of potentiometer 60.

The adder circuit 57 is designed so that the amplified voltage component derived from the movable tap of potentiometer 60 and supplied to one input of the first control arrangement 48 corresponds to the frequency to which the receiver is tuned and the amplified voltage component derived from terminal 58 corresponds to the desired receiver intermediate frequency. The addition of these two voltage components at one input of the first control arrangement 48 then corresponds to the desired local oscillator frequency of the receiver. When varactor diodes having identical characteristics are used in the oscillators, the control voltage for the oscillator can simultaneously be used to control the varactor diodes of the input tuning circuit. This then produces the conventional synchronism with corresponding axial tuning of the circuit elements. The required converters correspond, for example, to the converters of FIGS. 31 to 34.

The input to oscillator 49 is also supplied to the input tuned circuits, or the rf input circuitry, of the associated radio receiver.

The problems encounted in producing the required frequency synchronism between the oscillator and the input circuit of a superheterodyne receiver will now be described and thereafter an arrangement according to the invention which solves these problems will be described.

In order to attain the required synchronism between oscillator and input circuit, various solutions are employed. For example, it can be attempted to achieve the desired synchronism by specially cutting the discs of the rotary tuning capacitor. However, for electronic tuning systems varactor diodes which have specially adapted capacitance/voltage characteristics are not available. For this reason, tuning systems with varactor diodes employ the known three-point synchronism which, however, permits optimum synchronism only at three points of the frequency range. Even with precisely identical characteristics of the tuning elements or diodes, there result deviations in synchronism which result in sensitivity breaks within the tuning range. Moreover, inequality of the characteristics and deviations in the capacitance value of the padding capacitor produce additional deviations and thus increase the problem.

With the use of the circuit arrangement of FIG. 43, which will be described below, the deviations resulting from three-point synchronism, which are even more significant in practice than in theory, can be avoided completely.

Figure 43:
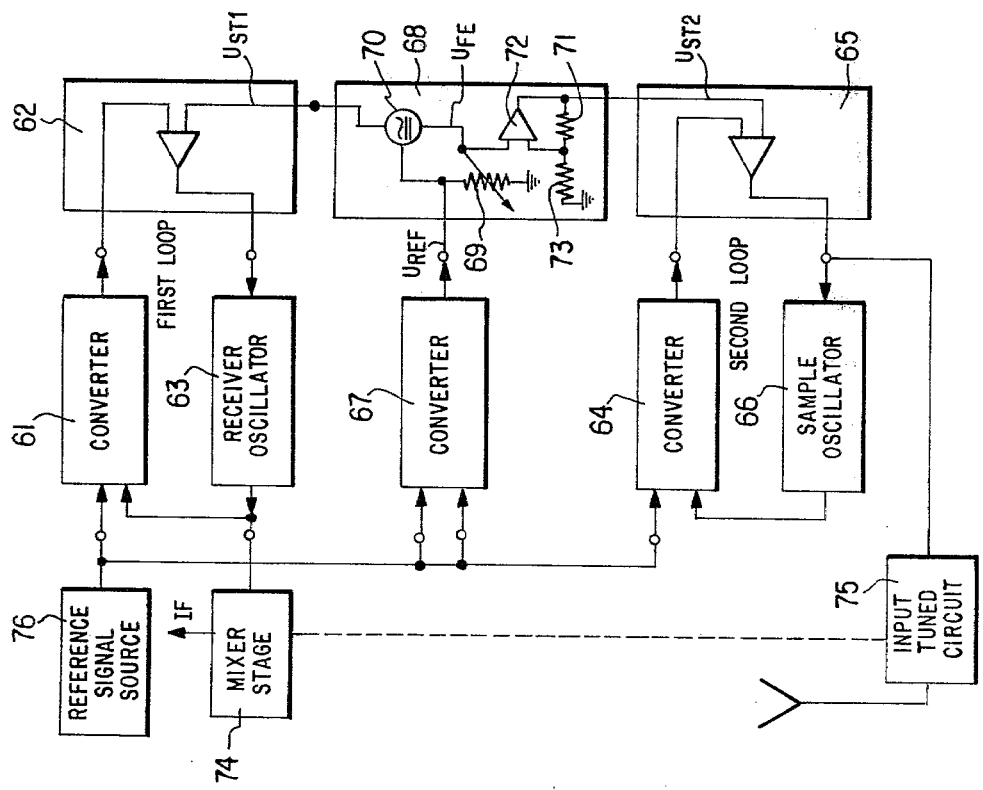

The arrangement of FIG. 43 includes two frequency control loops for controlling the tuning of an input tuned circuit 75 and for supplying the local oscillator signal to the mixer stage 74 of an otherwise conventional superheterodyne radio signal receiver. The first loop contains a converter 61, a control arrangement 62 and a receiver oscillator 63. The second loop contains a converter 64, a control arrangement 65 and a sample oscillator 66. A further converter 67 serves as a reference source for a frequency tuning arrangement 68. The control arrangements 62 and 65 are each composed of a comparator, or operational amplifier. The frequency tuning arrangement 68 includes a tuning potentiometer 69, an adder circuit 70 and an amplifier circuit 71. The amplifier circuit 71 is composed of an operational amplifier 72 and a voltage divider 73. The receiver oscillator 63 controls a receiver mixer stage 74 and an input tuning circuit 75 is connected with the control input of the sample oscillator 66. A reference signal source 76 supplies an a.c. control signal to the converters in the circuit. Circuit 75 contains the input tuned circuits for the radio receiver and corresponds to the similarly labeled box of FIG. 42. Oscillator 63 supplies the local oscillator signal to receiver mixer stage 74.

It is the purpose of the circuit to assure a constant frequency difference, equal to the intermediate frequency, between the oscillator frequency from oscillator 63 and the resonant frequency of the input circuit determined by the output voltage of control arrangement 65, over the entire frequency range of the receiver.

The reference frequency a.c. signal is fed from source 76 to one input of converter 61 of the first loop as well as to both inputs of converter 67 and one input of converter 64 of the second loop.

Both inputs of reference converter 67 are connected together. Due to the fact that the same input signal is present at both inputs of the reference converter 67, a d.c. component is produced at the output of the converter which corresponds to an input frequency ratio of 1. If this voltage were fed directly to the loops, the oscillators would set themselves to a frequency which would correspond to the reference frequency. The respective frequency which is set at each oscillator is equal to the reference frequency of the signal from source 76 multiplied by the ratio of the respective control voltage $U_{ST}$ for that oscillator to the reference voltage $U_{REF}$ produced by the converter 67. The dividing ratio of potentiometer 69 is therefore made equal to the ratio of received frequency to reference frequency. That means that a received frequency can always be associated with the voltage of the slider at potentiometer 69. If a voltage corresponding to the intermediate frequency is added to the slider voltage of the potentiometer, the result is a control voltage $U_{ST_1}$ at the input of the control arrangement 62 which corresponds to the desired frequency of the receiver oscillator. Thus, this desired frequency is also inevitably produced in the oscillator of the first loop.

The reference signal from source 76 has a frequency, for example, which lies above the highest frequency of the oscillator output signal fed to converter 61. The signal voltages must, of course, be selected to enable the pulse shaping stages of the converters to respond fully. The reference converter 67 furnishes the control voltage for the first and second loops via the tuning control arrangement 68. Since the adverse influences on all converters can be assumed to be identical, the reference converter 67 will act to compensate, or nullify, adverse influences on the oscillator frequency originating in any one of the circuit units. This occurs independently of the voltage/frequency characteristic of the receiver oscillator 63.

A control signal $U_{FE}$ which is proportional to the radio frequency to which the reciever is tuned is obtained from the slider of the tuning potentiometer 69 and is fed to one input of amplifier 71. The amplified signal reaches the input of the control arrangement 65 as control signal $U_{ST2}$ and, corresponding to this voltage, determines the desired frequency of the sample oscillator 66. The mechanism is the same as in the first loop. The resulting frequency of the output from sample oscillator 66 is equal to the received frequency multiplied by the gain of the amplifier arrangement 71–73.

If the loop voltage $U_{FE}$ were fed directly to the input of the control arrangement 65, the received frequency would be generated in the second loop simultaneously with the receiver oscillator frequency in the first loop. This would result in exact synchronism between oscillator frequency and received frequency. Under the prerequisite that the sample oscillator 66 has the same frequency/voltage characteristic as the input tuning circuit 75, a connection of the control lines can result in synchronism between the frequency of the sample oscillator and the resonant frequency of the input tuning circuit. Since, however, the sample oscillator is not intended to oscillate at the received frequency, the slider voltage of potentiometer 69 is not fed directly to the control arrangement 65 but is instead amplified in amplifier 72 so that the resulting higher frequency of the sample oscillator 66 corresponds to the amplifier gain factor. The voltage/frequency characteristic remains the same with respect to the relative change in frequency, however, so that synchronism between the resonant frequency of the input tuning circuit and the receiver oscillator 63 remains in effect.

Figure 44:
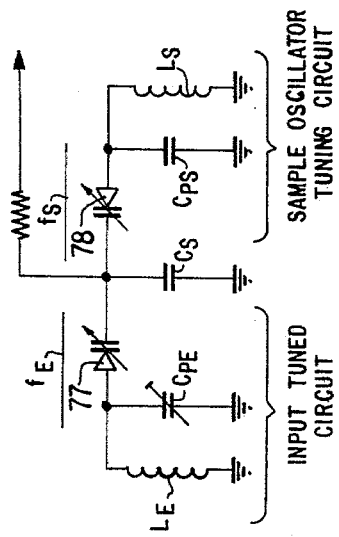
FIG. 44 is a circuit diagram of a portion of the circuit of FIG. 43.

FIG. 44 shows a circuit arrangement which establishes coincidence between the voltage-frequency characteristic of the input tuned circuit 75 and the tuning circuit of the sample oscillator in that a varactor diode 77 and variable capacitor $C_{PE}$ are employed in the input tuned circuit and a varactor diode 78 and capacitor $C_{PS}$ are employed in the sample oscillator tuning circuit 66 of FIG. 43, with diodes 77 and 78 having identical characteristics and capacitors $C_{PE}$ and $C_{PS}$ having identical relationships with the capacitance of the varactor diodes. It is here assumed that the capacitor $C_S$ connected between the tuning circuits has a very high capacitance compared to the capacitance values of the varactor diodes. A further condition is that the control signal for both varactor diodes 77 and 78 have the same magnitude. Identity between the varactor diodes is most easily achieved by fabricating them on a common semiconductor chip. Inductances $L_E$ and $L_S$ are connected in parallel with respective ones of capacitors $C_{PE}$ and $C_{PS}$ and are selected to have different inductance values in correspondence with the difference between the sample oscillator frequency $f_s$ and the input tuning circuit resonant frequency. The controlling signal to the circuit of FIG. 44 is delivered from the output of control arrangement 65 of FIG. 43 via a coupling resistor. In the circuit of FIG. 43, a digitally controlled voltage synthesizer can be provided in place of potentiometer 69.

Figure 45:
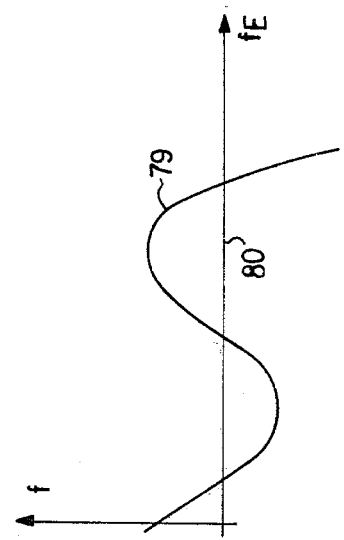
FIG. 45 is a signal diagram illustrating the operation of tuning circuits according to the invention.

In known sync circuits, the desired resonant frequency of the input tuning circuit, or receiving circuit, deviates from the received frequency $f_E$ in accordance with the synchronism curve 79 of FIG. 45 at most of the received frequencies and only at three points is there no deviation present. In contrast, the sync curve 80 does not deviate at all from the received frequency $f_E$ in the circuit according to the invention.

The converters can again have the form shown in FIGS. 31 to 34.

It is known that there exist in the art frequency synthesizers which, by digital processing produce from a reference signal at a given frequency, in the simplest case by means of frequency dividers, a signal at a desired frequency. Due to the digital processing, a plurality of undesirable noise signals appear at the output in addition to the desired frequency. These noise signals are annoying in many cases.

FIG. 46 shows an arrangement which avoids these drawbacks and in which the frequency of the reference signal from a reference signal source 81 controls converters 82 and 83. Converter 83 additionally receives the reference signal via a programmable frequency divider 84. Due to the frequency relationship between the signals at its inputs, converter 83 forms a corresponding direct output signal component which is fed to one input of an operational amplifier constituting a control arrangement 85. The other input of the operational amplifier receives the direct output signal component from converter 82 and the operational amplifier output is fed to the control input of an oscillator 86 so that its oscillator frequency is made equal to the divided frequency at the output of divider 84. If an LC oscillator is used as the oscillator 86, a noise-free output signal can be produced by its resonant circuit. The resonant frequency of the LC circuit corresponds to the oscillator frequency. If the resonant circuit is set to the divider frequency by self-regulation, only one frequency is produced, i.e. the divider output frequency in a form which is free of all noise components. Suitable converters are those of FIGS. 31 to 34.

The circuit of FIG. 46 constitutes a form of frequency processor in that it produces one or more output frequencies dependent upon the state of a set of digitally programmable inputs and one or more analog inputs, which influence the phase, amplitude, or frequency of the output. Such analog inputs can be applied via lines 5.

Radio and television receivers, as well as many types of appliances and industrial equipment, are today often operated by remote control units which generally have a relatively complex structure. FIG. 47 shows a specific example of a frequency processor constituting a remote control circuit according to the invention which can be realized with simple means and which is the unit remote from the receiver. The remote control circuit of FIG. 47 includes a loop consisting of a converter 87, a control arrangement 88 composed of an operational amplifier and a signal source 93, and an oscillator 89. The reference signal from a reference signal source 90 is fed to both inputs of a converter 91 to control that converter and is fed to a programmable frequency divider 92. Divider 92 could be, for example, a presettable counter whose count is preset by manual actuation of a selected input, the inputs being shown as a series of lines along the left edge of block 92. Each input corresponds to a particular count presetting which, in turn, corresponds to a selected output frequency. The output signal from converter 91 is fed to one input of the control circuit 88. At one input, converter 87 receives the divided reference frequency signal from the programmed frequency divider 92. Due to the provision of the frequency control loop, a signal appears at the output of the oscillator 89 with a frequency which is proportional to the output frequency of the frequency divider 92 when signal source 93 is not influencing or varying the output from converter 91 when the signal source 93 shown in FIG. 47 is not present in the circuit, or at least is not active. The output signal from oscillator 89 is supplied to a suitable transmitter 94 capable of emitting a corresponding light, radio or acoustic signal to the apparatus to be controlled.

For other remote control applications, for example, when information is to be superimposed on the oscillator output signal, source 93 could be provided and could be operated to produce a constant or varying signal which varies or frequency modulates the output signal from oscillator 89. For example, source 93 could be a microphone to permit speech signals to be transmitted, or it could be any suitable transducer for permitting temperature, pressure, wind, solar energy, etc. data to be transmitted. The frequency shifted or modulated signal from oscillator 89 controls the subsequently connected transmitter 94 which transmits the modulated signal. By suitable programming of the frequency divider 92, it can operate to select the transmission channel, i.e. particular carrier frequency, and by the frequency modulation signal from source 93 the desired instruction can be transmitted. Suitable converters are the converters of FIGS. 31 to 34.

Source 93 represents one possible analog signal source of the type referred to above with reference to FIG. 46.

According to various other embodiments of the invention, the frequency relationship on which the value of the d.c. component depends could be the sum, product, or quotient of the two a.c. input signals, or a function thereof.

In accordance with certain further embodiments of the invention, the system could be constructed to enable a frequency control signal to be applied to vary the desired output signal frequency from time to time. This could be achieved by supplying the output signal and a fixed frequency reference signal to a frequency-voltage converter, employing the converter output to control a frequency generator which produces the output signal, and supplying an a.c. control signal to give the converter a characteristic which causes the frequency of the generator output signal to be maintained equal to, or a predetermined function of, the frequency of the a.c. control signal. Preferably, the a.c. control signal could be supplied only for a short time, and a representation of that frequency could then be stored. Subsequent application of an a.c. control signal at a different frequency would then act to bring the frequency of the generator output signal to a value determined by the different frequency. Representations of a plurality of frequencies could be stored simultaneously.

According to still further embodiments of the invention, the system could be composed of two frequency-voltage converters each receiving a single input signal and producing an output having a direct component dependent on the frequency of its associated input signal, and a control arrangement receiving the direct components from the two converters and producing therefrom a direct signal which controls the frequency of the output signal produced by a voltage-controlled frequency generator.

It will be understood that the above description of the present invention is susceptible to various modifications, changes and adaptations, and the same are intended to be comprehended within the meaning and range of equivalents of the appended claims.

What is claimed is:

1. A circuit for producing a frequency dependent output signal in response to two a.c. input signals comprising: converter means connected to receive the two a.c. input signals for furnishing an output signal having a steady state d.c. component which varies in dependence on changes in the value of a relationship between the frequencies of the two a.c. input signals, which relationship covers a range containing unequal frequency values for the two input signals; and means connected to said converter means for producing an a.c. output signal whose frequency is a function of the value of such d.c. component, wherein said converter means comprises a pulse processor producing an output signal from two input pulse signals constituting the a.c. input signals, said pulse processor including means producing an output signal in the form of a pulse train the repetition frequency of which is proportional to the frequency of one a.c. input pulse signal and the duration of each pulse of which is inversely proportional to the frequency of the other input pulse signal, and integrating means connected to generate from the output signal in the form of a pulse train a signal corresponding to the time integral thereof and constituting the steady state d.c. component of said converter means output signal.

* * * * *